US010977539B1

(12) United States Patent
Herrington et al.

(10) Patent No.: US 10,977,539 B1
(45) Date of Patent: Apr. 13, 2021

(54) SYSTEMS AND METHODS FOR USE OF CAPACITIVE MEMBER TO PREVENT CHIP FRAUD

(71) Applicant: Capital One Services, LLC, McLean, VA (US)

(72) Inventors: Daniel Herrington, New York, NY (US); Stephen Schneider, Midlothian, VA (US); Tyler Maiman, Melville, NY (US)

(73) Assignee: CAPITAL ONE SERVICES, LLC, McLean, VA (US)

( * ) Notice: Subject to any disclaimer, the term of this patent is extended or adjusted under 35 U.S.C. 154(b) by 0 days.

(21) Appl. No.: 16/723,792

(22) Filed: Dec. 20, 2019

(51) Int. Cl.
| G06K 7/08 | (2006.01) |
| G06K 19/06 | (2006.01) |
| G06K 19/073 | (2006.01) |
| H01L 23/00 | (2006.01) |

(52) U.S. Cl.
CPC ...... *G06K 19/07318* (2013.01); *H01L 23/573* (2013.01)

(58) Field of Classification Search
USPC .................................................. 235/451, 492
See application file for complete search history.

(56) References Cited

U.S. PATENT DOCUMENTS

| 4,079,646 A | 3/1978 | Morishita |
| 4,192,449 A | 3/1980 | Tippetts |
| 4,297,566 A | 10/1981 | Ahmann |
| 4,359,632 A | 11/1982 | Fisher |
| 4,360,727 A | 11/1982 | Lehmann |
| 4,398,902 A | 8/1983 | Mangum |
| 4,409,471 A | 10/1983 | Aigo |
| 4,431,911 A | 2/1984 | Rayburn |
| 4,441,391 A | 4/1984 | Seaman |
| 4,447,716 A | 5/1984 | Aigo |
| 4,485,298 A | 11/1984 | Stephens et al. |
| 4,503,323 A | 3/1985 | Flam |
| 4,506,148 A | 3/1985 | Berthold et al. |
| 4,511,796 A | 4/1985 | Aigo |
| 4,563,575 A | 1/1986 | Hoppe et al. |
| 4,589,687 A | 5/1986 | Hannon |
| 4,593,384 A | 6/1986 | Kleijne |
| 4,605,845 A | 8/1986 | Takeda |

(Continued)

FOREIGN PATENT DOCUMENTS

| EP | 1850255 A1 | 10/2007 |
| EP | 1710692 B1 | 9/2018 |

(Continued)

*Primary Examiner* — Tuyen K Vo
(74) *Attorney, Agent, or Firm* — Hunton Andrews Kurth LLP

(57) ABSTRACT

Example embodiments of systems and methods for preventing chip fraud are provided. A chip fraud prevention system may comprise a device including a chip, wherein the chip is at least partially encompassed in a chip pocket. One or more connections may be communicatively coupled to one or more surfaces of the chip, and a capacitance member may be coupled to a surface of the chip. The capacitance member may comprise a known capacitance value and the chip may comprise a memory containing an applet, wherein the applet is configured to measure the capacitance value of the capacitance member.

17 Claims, 23 Drawing Sheets

(56) References Cited

U.S. PATENT DOCUMENTS

| | | | |
|---|---|---|---|
| 4,625,102 A | 11/1986 | Rebjock et al. |
| 4,637,544 A | 1/1987 | Quercetti |
| 4,727,246 A | 2/1988 | Hara et al. |
| 4,772,783 A | 9/1988 | Ono et al. |
| 4,775,093 A | 10/1988 | Lin |
| 4,795,895 A | 1/1989 | Hara et al. |
| 4,805,797 A | 2/1989 | Natori |
| 4,819,828 A | 4/1989 | Mirabel |
| 4,835,843 A | 6/1989 | Wendt et al. |
| 4,960,983 A | 10/1990 | Inoue |
| 4,987,683 A | 1/1991 | Brych |
| 4,999,601 A | 3/1991 | Gervais |
| 5,105,073 A | 4/1992 | Kovach et al. |
| 5,281,795 A | 1/1994 | Harlan |
| 5,288,979 A | 2/1994 | Kreft |
| 5,303,472 A | 4/1994 | Mbanugo |
| 5,331,139 A | 7/1994 | Lee |
| 5,341,923 A | 8/1994 | Arasim |
| 5,376,778 A | 12/1994 | Kreft |
| 5,416,423 A | 5/1995 | De Borde |
| 5,424,522 A | 6/1995 | Iwata |
| 5,518,171 A | 5/1996 | Moss |
| 5,529,174 A | 6/1996 | McQueeny |
| 5,531,145 A | 7/1996 | Haghiri-Tehrani |
| 5,545,884 A | 8/1996 | Seto et al. |
| 5,557,089 A | 9/1996 | Hall et al. |
| 5,569,898 A | 10/1996 | Fisher et al. |
| 5,600,175 A | 2/1997 | Orthmann |
| 5,703,350 A | 12/1997 | Suhir |
| 5,775,516 A | 7/1998 | McCumber et al. |
| 5,779,055 A | 7/1998 | Lacy, III |
| 5,782,371 A | 7/1998 | Baerenwald et al. |
| 5,796,085 A | 8/1998 | Bleier |
| 5,836,779 A | 11/1998 | Vogler |
| 5,837,153 A | 11/1998 | Kawan |
| 5,852,289 A | 12/1998 | Masahiko |
| 5,861,662 A | 1/1999 | Candelore |
| 5,905,252 A | 5/1999 | Magana |
| 5,949,060 A | 9/1999 | Schattschneider et al. |
| 5,984,179 A | 11/1999 | May |
| 6,020,627 A | 2/2000 | Fries et al. |
| 6,041,998 A | 3/2000 | Goldberg |
| 6,073,856 A | 6/2000 | Takahashi |
| 6,094,831 A | 8/2000 | Shigyo |
| 6,095,423 A | 8/2000 | Houdeau et al. |
| 6,105,872 A | 8/2000 | Lotz |
| 6,109,439 A | 8/2000 | Goade, Sr. |
| 6,149,064 A | 11/2000 | Yamaoka et al. |
| 6,186,402 B1 | 2/2001 | Johnson |
| 6,196,594 B1 | 3/2001 | Keller |
| 6,224,108 B1 | 5/2001 | Klure |
| 6,230,977 B1 | 5/2001 | Johnson |
| 6,308,832 B1 | 10/2001 | Pirro et al. |
| 6,364,114 B1 | 4/2002 | Glassman |
| 6,371,364 B1 | 4/2002 | Maillot et al. |
| 6,386,459 B1 | 5/2002 | Patrice et al. |
| 6,424,029 B1* | 7/2002 | Giesler .............. G06K 19/0716 |
| | | 235/488 |
| 6,439,613 B2 | 8/2002 | Klure |
| 6,443,041 B1 | 9/2002 | Pirovano et al. |
| 6,488,152 B1 | 12/2002 | Steffann |
| 6,543,809 B1 | 4/2003 | Kistner et al. |
| 6,568,593 B2 | 5/2003 | Hetzer |
| 6,571,953 B2 | 6/2003 | Sherline et al. |
| 6,593,167 B2 | 7/2003 | Dobashi et al. |
| 6,601,329 B2 | 8/2003 | Vaudreuil |
| 6,629,637 B1 | 10/2003 | Von Der Lippe et al. |
| 6,651,891 B1 | 11/2003 | Zakel et al. |
| 6,729,538 B2 | 5/2004 | Farquhar |
| 6,742,117 B1 | 5/2004 | Hikita et al. |
| 6,843,408 B1 | 1/2005 | Agren |
| 7,000,774 B2 | 2/2006 | Bryant |
| 7,003,678 B2 | 2/2006 | Ikefuji et al. |
| 7,080,776 B2 | 7/2006 | Lewis et al. |
| 7,143,935 B2 | 12/2006 | Marta |
| 7,175,085 B2 | 2/2007 | Oguchi |
| 7,207,107 B2 | 4/2007 | Usner et al. |
| 7,299,968 B2 | 11/2007 | Mittmann et al. |
| 7,311,263 B2 | 12/2007 | Eichler et al. |
| 7,360,711 B2 | 4/2008 | Jung et al. |
| 7,559,468 B2 | 7/2009 | Kawaguchi |
| 7,699,225 B2 | 4/2010 | Horiguchi et al. |
| 7,806,340 B2 | 10/2010 | Daio et al. |
| 7,844,255 B2 | 11/2010 | Petrov et al. |
| 7,868,441 B2 | 1/2011 | Eaton et al. |
| 7,931,148 B2 | 4/2011 | Hansen et al. |
| 8,006,834 B2 | 8/2011 | Marcinkowski |
| 8,025,207 B1 | 9/2011 | Correll |
| 8,038,003 B2 | 10/2011 | Rometty et al. |
| 8,267,327 B2 | 9/2012 | Tsao et al. |
| 8,403,229 B2 | 3/2013 | McGrane |
| 8,496,183 B2 | 7/2013 | Kiyozuka |
| 8,613,389 B2 | 12/2013 | Payne |
| 8,616,373 B2 | 12/2013 | Hansen et al. |
| 8,783,549 B2 | 7/2014 | Jo |
| 8,800,768 B2 | 8/2014 | Corbat et al. |
| 8,915,434 B2 | 12/2014 | Mitchell et al. |
| 9,242,436 B1 | 1/2016 | Hallman et al. |
| 9,569,769 B2 | 2/2017 | Smith et al. |
| 9,576,161 B2 | 2/2017 | Tanaka et al. |
| 9,760,816 B1 | 9/2017 | Williams et al. |
| 9,818,049 B2 | 11/2017 | Goedee et al. |
| 2002/0046635 A1 | 4/2002 | Christen et al. |
| 2002/0070280 A1 | 6/2002 | Ikefuji et al. |
| 2002/0079372 A1 | 6/2002 | Hino |
| 2002/0174336 A1 | 11/2002 | Sakakibara et al. |
| 2003/0052033 A1 | 3/2003 | Schwester |
| 2003/0069860 A1 | 4/2003 | Berndtsson et al. |
| 2003/0164320 A1 | 9/2003 | Magnusson |
| 2003/0205624 A1 | 11/2003 | Huang et al. |
| 2004/0026520 A1 | 2/2004 | Kawai et al. |
| 2004/0062012 A1* | 4/2004 | Murohara ........ G06K 19/07769 |
| | | 361/737 |
| 2004/0079805 A1 | 4/2004 | Nagata et al. |
| 2004/0079806 A1 | 4/2004 | Ogushi |
| 2004/0123715 A1 | 7/2004 | Stuckel et al. |
| 2004/0159570 A1 | 8/2004 | Schwester |
| 2005/0103832 A1 | 5/2005 | Correll |
| 2005/0127166 A1 | 6/2005 | Minemura |
| 2005/0211600 A1 | 9/2005 | Saito |
| 2005/0218027 A1 | 10/2005 | Lammers et al. |
| 2006/0016704 A1 | 1/2006 | Moskovich et al. |
| 2006/0027481 A1 | 2/2006 | Gelardi et al. |
| 2006/0044138 A1 | 3/2006 | Sin |
| 2006/0086793 A1 | 4/2006 | Oguchi |
| 2006/0091212 A1 | 5/2006 | Chien et al. |
| 2006/0118642 A1 | 6/2006 | Latka et al. |
| 2006/0266672 A1 | 11/2006 | Young |
| 2006/0273149 A1 | 12/2006 | Awano |
| 2006/0278640 A1 | 12/2006 | Watts |
| 2006/0289665 A1 | 12/2006 | Yoda |
| 2007/0051653 A1 | 3/2007 | Tilton |
| 2007/0187264 A1 | 8/2007 | Hofte et al. |
| 2007/0187273 A1 | 8/2007 | Grosskopf |
| 2007/0187835 A1 | 8/2007 | Chi |
| 2007/0193922 A1 | 8/2007 | Bacon et al. |
| 2007/0251997 A1 | 11/2007 | Brown et al. |
| 2008/0083827 A1 | 4/2008 | Ho |
| 2008/0142393 A1 | 6/2008 | Grosskopf |
| 2008/0164320 A1 | 7/2008 | Garrido-Gadea et al. |
| 2008/0251905 A1 | 10/2008 | Pope et al. |
| 2008/0314784 A1 | 12/2008 | Schroeder |
| 2009/0047104 A1 | 2/2009 | Jung |
| 2009/0277964 A1* | 11/2009 | Schroder .......... G06K 19/07345 |
| | | 235/492 |
| 2010/0025400 A1 | 2/2010 | Sytsma |
| 2010/0122984 A1 | 5/2010 | Kim et al. |
| 2010/0133123 A1 | 6/2010 | Thibault |
| 2010/0182020 A1 | 7/2010 | Thornley et al. |
| 2010/0206942 A1 | 8/2010 | Rometty et al. |
| 2010/0288833 A1 | 11/2010 | Santos et al. |
| 2011/0068159 A1 | 3/2011 | Yamada et al. |
| 2011/0101080 A1 | 5/2011 | Ho |
| 2011/0233098 A1 | 9/2011 | Ye et al. |

(56) References Cited

U.S. PATENT DOCUMENTS

| | | |
|---|---|---|
| 2011/0233099 A1 | 9/2011 | Pitt |
| 2011/0255253 A1 | 10/2011 | Campbell et al. |
| 2011/0259899 A1 | 10/2011 | McClure |
| 2011/0290675 A1 | 12/2011 | Shiue et al. |
| 2012/0048924 A1 | 3/2012 | Hong |
| 2012/0074232 A1 | 3/2012 | Spodak et al. |
| 2012/0106113 A1 | 5/2012 | Kirmayer |
| 2012/0123937 A1 | 5/2012 | Spodak |
| 2012/0126004 A1 | 5/2012 | Chen |
| 2012/0173432 A1 | 7/2012 | Yeager |
| 2012/0181158 A1 | 7/2012 | Chang |
| 2013/0024372 A1 | 1/2013 | Spodak et al. |
| 2013/0030997 A1 | 1/2013 | Spodak et al. |
| 2013/0068651 A1 | 3/2013 | Gelardi et al. |
| 2013/0068844 A1 | 3/2013 | Bosquet et al. |
| 2013/0134216 A1 | 5/2013 | Spodak et al. |
| 2013/0233754 A1 | 9/2013 | Liu |
| 2013/0306512 A1 | 11/2013 | Smith |
| 2014/0136417 A1 | 5/2014 | Spodak et al. |
| 2014/0274641 A1 | 9/2014 | Tattersall |
| 2014/0346220 A1 | 11/2014 | Saulas |
| 2015/0108606 A1 | 4/2015 | Lamy et al. |
| 2015/0136777 A1 | 5/2015 | Baillies |
| 2015/0166218 A1 | 6/2015 | Banducci |
| 2015/0225157 A1 | 8/2015 | Nakamura et al. |
| 2016/0009473 A1 | 1/2016 | Korinek et al. |
| 2016/0031624 A1 | 2/2016 | Pascua et al. |
| 2016/0137373 A1 | 5/2016 | Olschan et al. |
| 2016/0162712 A1 | 6/2016 | Ozawa et al. |
| 2016/0193748 A1 | 7/2016 | Luhmann |
| 2016/0229081 A1 | 8/2016 | Williams et al. |
| 2016/0272396 A1 | 9/2016 | Cataudella et al. |
| 2016/0272398 A1 | 9/2016 | Cataudella et al. |
| 2017/0236125 A1* | 8/2017 | Guise .................. G06Q 20/20 705/17 |
| 2017/0344869 A1 | 11/2017 | Williams et al. |
| 2017/0351880 A1 | 12/2017 | Ozawa et al. |
| 2018/0022498 A1 | 1/2018 | Everett |
| 2018/0044051 A1 | 2/2018 | Chang |
| 2018/0079248 A1 | 3/2018 | Pascua et al. |
| 2018/0114036 A1 | 4/2018 | Spodak et al. |
| 2018/0227276 A1 | 8/2018 | Chen |
| 2018/0240103 A1* | 8/2018 | Rezayee ............. G06Q 20/341 |
| 2020/0082238 A1* | 3/2020 | Landauer .......... G06K 19/0723 |

FOREIGN PATENT DOCUMENTS

| | | |
|---|---|---|
| WO | 2007003301 A1 | 1/2007 |
| WO | 2007052116 A1 | 5/2007 |
| WO | 2013051029 A | 4/2013 |
| WO | 2013112839 A | 8/2013 |
| WO | 2016172449 A1 | 10/2016 |

\* cited by examiner

SYSTEMS AND METHODS FOR USE OF CAPACITIVE MEMBER TO PREVENT CHIP FRAUD

FIELD OF THE INVENTION

The present disclosure relates to systems and methods for the use of a capacitive fraud prevention member in a device, such as a smartcard, and more particularly, to systems and methods utilizing a fraud prevention capacitive member to prevent chip fraud.

BACKGROUND

Removing a chip from one smartcard and inserting it into another smartcard or other device increases the risk of fraud. Moreover, conventional chip placement methods, such as methods that use smooth milling patterns, are ineffective due to the ease of chip removal. For example, for smartcards having chips, there is a significant likelihood of the removal of chips that are not securely positioned, such as by physical removal or thermal removal, and these chips may then be subject to re-implantation into another card or other device. As a consequence, smartcards having chips may be fraudulently manipulated, reprogrammed, and/or otherwise misused.

These and other deficiencies exist. Accordingly, there is a need for a chip fraud prevention system that improves security, reduces the risk of fraud, reduces cost, and increases durability.

SUMMARY

Aspects of the disclosed technology include systems and methods for the use of a fraud prevention capacitive member containing for a card, such as a smartcard. Various embodiments describe systems and methods for utilizing a fraud prevention capacitive member to prevent chip fraud.

Embodiments of the present disclosure provide a chip fraud prevention system comprising a device including a chip, the chip at least partially encompassed in a chip pocket; one or more connections communicatively coupled to one or more surfaces of the chip; and a capacitance member coupled to a surface of the chip, wherein the capacitance member comprises a known capacitance value and wherein the chip comprises a memory containing an applet, the applet configured to measure the capacitance value of the capacitance member.

Embodiments of the present disclosure provide a method of preventing chip fraud, the method comprising the steps of positioning a chip of a device in a reservoir, the chip comprising a memory containing an applet; communicatively coupling one or more components to a surface of the chip; and coupling a capacitance member to the surface of the chip, wherein the capacitance member is in data communication with the chip and comprises a capacitance value, and wherein the applet is configured to detect the capacitance value of the capacitance member.

Embodiments of the present disclosure provide a contactless card including a substrate layer, the contactless card comprising one or more integrated circuits positioned in one or more housings; one or more connections communicatively coupled to one or more surfaces of each of the one or more integrated circuits, and one or more capacitance members communicatively coupled to one or more surfaces of each of the one or more integrated circuits, wherein the capacitance members comprise a known capacitance value based on the length and metal alloy of the capacitance members.

Further features of the disclosed design, and the advantages offered thereby, are explained in greater detail hereinafter with reference to specific example embodiments illustrated in the accompanying drawings.

DETAILED DESCRIPTION OF EXAMPLE EMBODIMENTS

Systems and methods described herein are directed to improving durability for chip placement methods in a contactless card, including saw tooth milling pattern and other means of preventing removal of the chip described herein. As further described below, the saw tooth milling pattern promotes the success of adhesion of the chip to a chip pocket of the contactless card while also creating an uneven cutting process to prevent removal of the chip. As a consequence of this and the other removal prevention designs described herein, chip fraud is reduced or eliminated. In addition, manufacturing processes can be improved and production costs may be decreased. Further cost and resource savings may be achieved through a decrease in fraud, including decreased needs for investigating and refunding fraudulent transactions, customer support, and replacing smartcards.

Figure 1A:
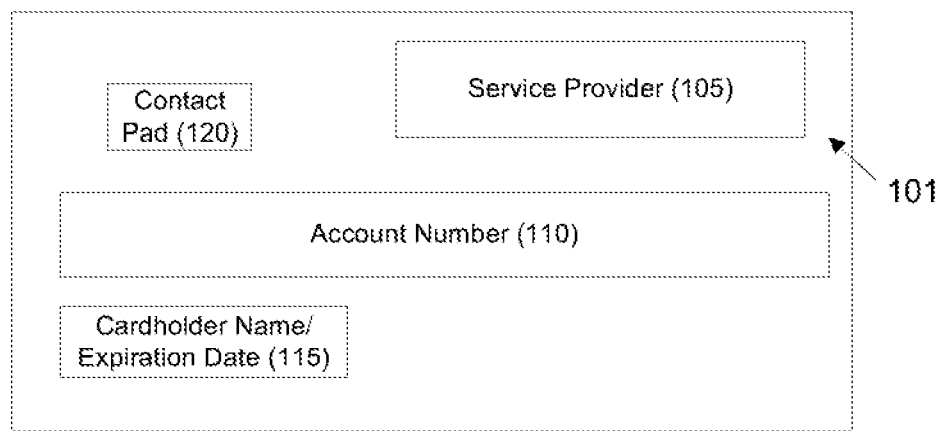
FIG. 1A is an illustration of a card according to an example embodiment.

FIG. 1A illustrates one or more contactless cards 100, which may comprise a payment card, such as a credit card, debit card, or gift card, issued by a service provider 105 displayed on the front or back of the card 100. In some examples, the contactless card 100 is not related to a payment card, and may comprise, without limitation, an identification card, a membership card, a data storage card, or other type of card. In some examples, the payment card may comprise a contactless card, such as a dual interface contactless payment card, a contact card that requires physical contact with a card reader, or other type of chip-based card. The card 100 may comprise a substrate 101, which may include a single layer or one or more laminated layers composed of plastics, metals, and other materials. Exemplary substrate materials include polyvinyl chloride, polyvinyl chloride acetate, acrylonitrile butadiene styrene, polycarbonate, polyesters, anodized titanium, palladium, gold, carbon, paper, and biodegradable materials. In some examples, the card 100 may have physical characteristics compliant with the ID-1 format of the ISO/IEC 7810 standard, and the card may otherwise be compliant with the ISO/IEC 14443 standard. However, it is understood that the card 100 according to the present disclosure may have different characteristics, and the present disclosure does not require a card to be implemented in a payment card.

The card 100 may comprise account number information 110 that may be displayed on the front and/or back of the card 100. The card 100 may also include identification information 115 displayed on the front and/or back of the card 100, and a contact pad 120. In some examples, identification information 115 may comprise one or more of cardholder name and expiration date of the card 100. The contact pad 120 may be configured to establish contact with another communication device, such as a user device, smart phone, laptop, desktop, or tablet computer. The card 100 may also include processing circuitry, antenna and other components not shown in FIG. 1A. These components may be located behind the contact pad 120 or elsewhere on the substrate 101. The card 100 may also include a magnetic strip or tape, which may be located on the back of the card (not shown in FIG. 1A).

Figure 1B:
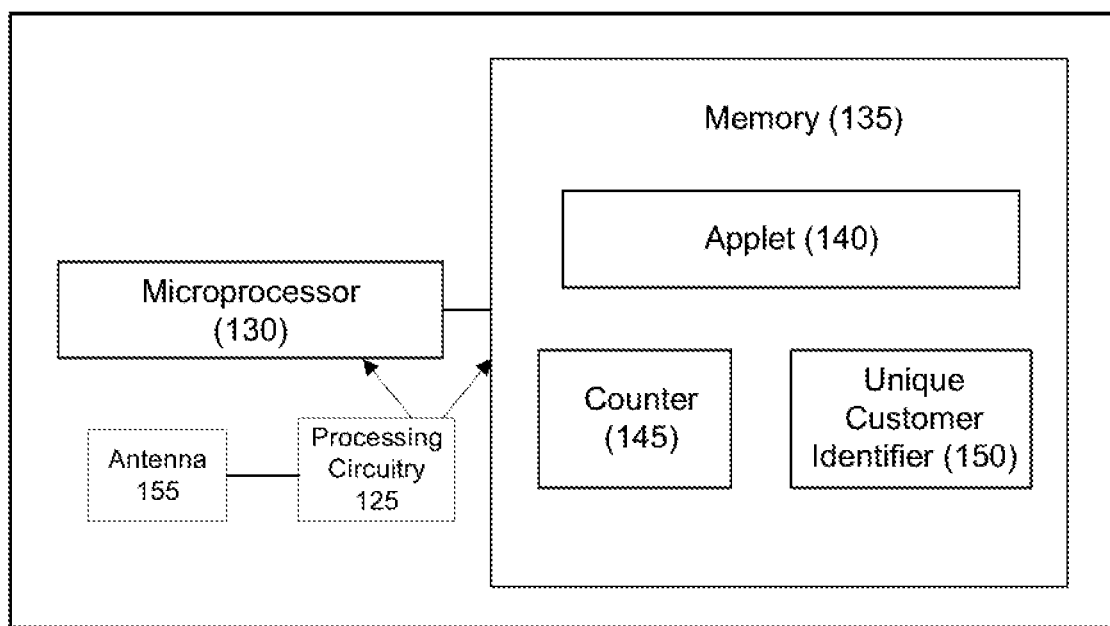
FIG. 1B is an illustration of a contact pad of a card according to an example embodiment.

As illustrated in FIG. 1B, the contact pad 120 of FIG. 1A may include processing circuitry 125 for storing and processing information, including a microprocessor 130 and a memory 135. It is understood that the processing circuitry 125 may contain additional components, including processors, memories, error and parity/CRC checkers, data encoders, anticollision algorithms, controllers, command decoders, security primitives and tamperproofing hardware, as necessary to perform the functions described herein.

The memory 135 may be a read-only memory, write-once read-multiple memory or read/write memory, e.g., RAM, ROM, and EEPROM, and the card 100 may include one or more of these memories. A read-only memory may be factory programmable as read-only or one-time programmable. One-time programmability provides the opportunity to write once then read many times. A write once/read-multiple memory may be programmed at a point in time after the memory chip has left the factory. Once the memory is programmed, it may not be rewritten, but it may be read many times. A read/write memory may be programmed and re-programed many times after leaving the factory. It may also be read many times.

The memory 135 may be configured to store one or more applets 140, one or more counters 145, and a customer identifier 150. The one or more applets 140 may comprise one or more software applications configured to execute on one or more cards, such as Java Card applet. However, it is understood that applets 140 are not limited to Java Card applets, and instead may be any software application operable on cards or other devices having limited memory. The one or more counters 145 may comprise a numeric counter sufficient to store an integer. The customer identifier 150 may comprise a unique alphanumeric identifier assigned to a user of the card 100, and the identifier may distinguish the user of the card from other card users. In some examples, the customer identifier 150 may identify both a customer and an account assigned to that customer and may further identify the card associated with the customer's account.

The processor and memory elements of the foregoing exemplary embodiments are described with reference to the contact pad, but the present disclosure is not limited thereto. It is understood that these elements may be implemented outside of the pad 120 or entirely separate from it, or as further elements in addition to processor 130 and memory 135 elements located within the contact pad 120.

In some examples, the card 100 may comprise one or more antennas 155. The one or more antennas 155 may be placed within the card 100 and around the processing circuitry 125 of the contact pad 120. For example, the one or more antennas 155 may be integral with the processing circuitry 125 and the one or more antennas 155 may be used with an external booster coil. As another example, the one or more antennas 155 may be external to the contact pad 120 and the processing circuitry 125.

In an embodiment, the coil of card 100 may act as the secondary of an air core transformer. The terminal may communicate with the card 100 by cutting power or amplitude modulation. The card 100 may infer the data transmitted from the terminal using the gaps in the card's power connection, which may be functionally maintained through one or more capacitors. The card 100 may communicate back by switching a load on the card's coil or load modulation. Load modulation may be detected in the terminal's coil through interference.

Figure 2A:
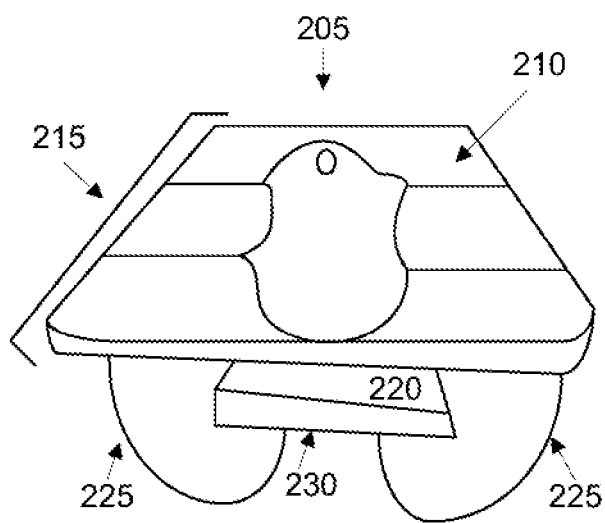
FIG. 2A is an illustration of a contact pad and a chip according to an example embodiment.

As illustrated in FIG. 2A, system 200 depicts various schematics of a surface of a contact pad and a chip. FIG. 2A may reference the same or similar components as illustrated in FIG. 1A and FIG. 1B, including the card, chip and the contact pad. In some examples, the chip may comprise an integrated circuit. In one example, contact pad 205 may include a planar surface 210 comprising a pad substrate 215 and a chip 220 embedded, integrated, or otherwise in communication with contact pad 205 via one or more electronic components or connections 225. For example, one or more connections 225 may comprise one or more leads, wires or pins, or any combination thereof, communicatively coupled to chip 220. One or more connections 225 may be configured to connect to a chip surface 230 of the chip 220. As illustrated in FIG. 2A, the chip surface 230 may comprise an exterior region of chip 220, and the chip 220 is shown as projecting outwards from card 205 to depict its connectivity.

Figure 2B:
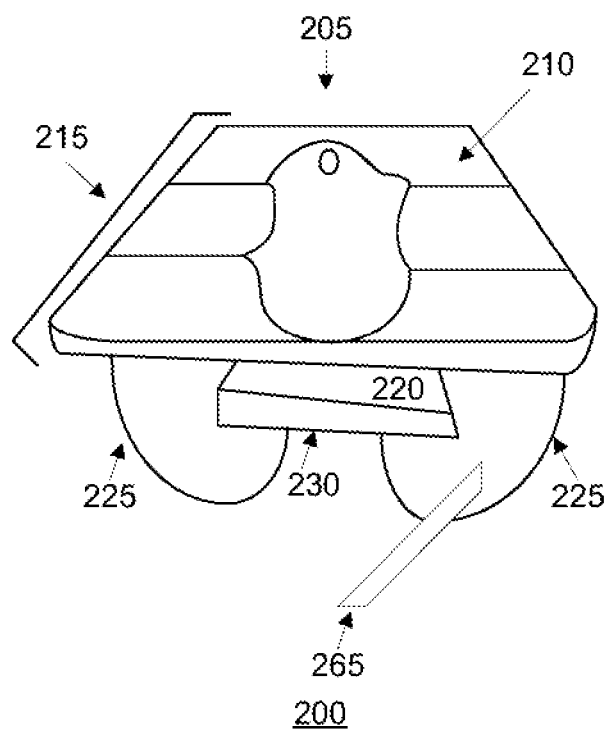
FIG. 2B is an illustration of a contact pad and a chip according to an example embodiment.

As illustrated in FIG. 2B, the one or more connections 225, as previously depicted in FIG. 2A, are shown as being removed. FIG. 2B may reference the same or similar components of contact pad 205 as previously described with reference to FIG. 2A. In some examples, removal of the one or more connections 225 may take place by one or more structures 265, including but not limited to one or more of wire cutters, scissors, clippers, picks, pliers, pins, threads, needles, blades, knives, or any other structure, or any combination thereof, configured to remove the one or more connections 225.

Figure 2C:
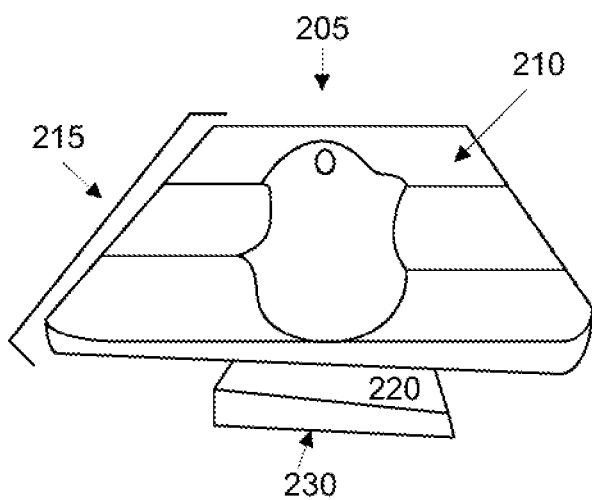
FIG. 2C is an illustration of a contact pad and a chip according to an example embodiment.

As illustrated in FIG. 2C, the one or more connections 225, as previously depicted in FIG. 2B, have been severed due to the removal by one or more structures 265 as explained above with reference to FIG. 2B. FIG. 2C may reference the same or similar components of card 205 as previously described with reference to FIG. 2B.

Figure 2D:
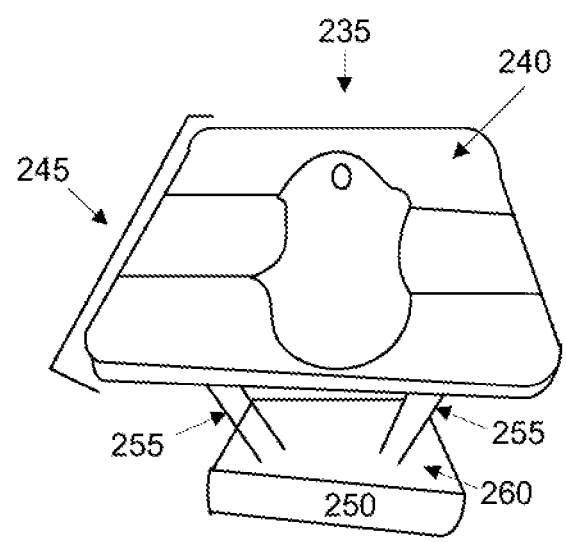
FIG. 2D is an illustration of a contact pad and a chip according to an example embodiment.

FIG. 2D illustrates another example of a contact pad and a chip. As shown in FIG. 2D, contact pad 235 includes a planar surface 240 comprising a pad substrate 245 and a chip 250 embedded, integrated, or otherwise in communication with card 205 via one or more electronic components or connections 255. For example, one or more connections 255 may comprise one or more wires or pins, or any combination thereof, communicatively coupled to chip 250. One or more connections 255 may be configured to connect a surface 260 of the chip 250. As illustrated in FIG. 2D, surface 260 may comprise an interior region of chip 250, and the chip 250 is shown as projecting outwards from card 205 to depict its connectivity. As further illustrated in FIG. 2D, one or more connections 255 of card 235 have not yet been severed.

Figure 2E:
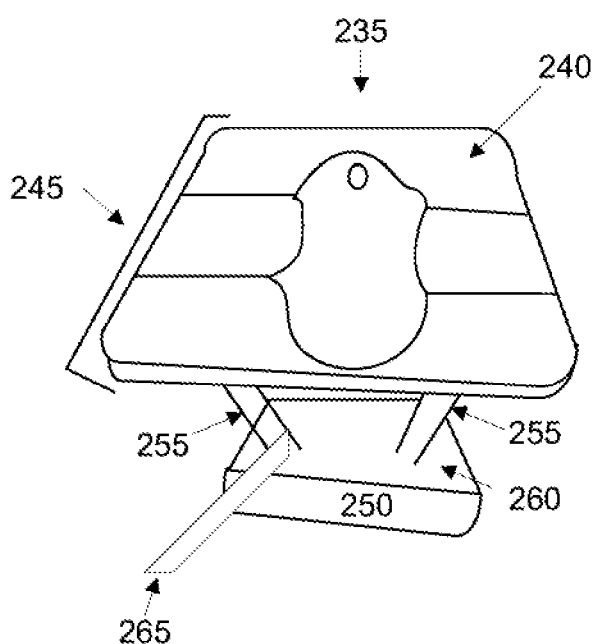
FIG. 2E is an illustration of a contact pad and a chip according to an example embodiment.

As illustrated in FIG. 2E, the one or more connections 255 of card 235, as previously depicted in FIG. 2D, are shown as being removed. FIG. 2E may reference the same or similar components of card 235 as previously described with reference to FIG. 2D. In some examples, removal of the one or more leads 255 may take place by one or more structures 265, including but not limited to one or more of wire cutters, scissors, clippers, picks, pliers, pins, threads, needles, blades, knives, or any other structure, or any combination thereof, configured to remove one or more connections 255.

Figure 2F:
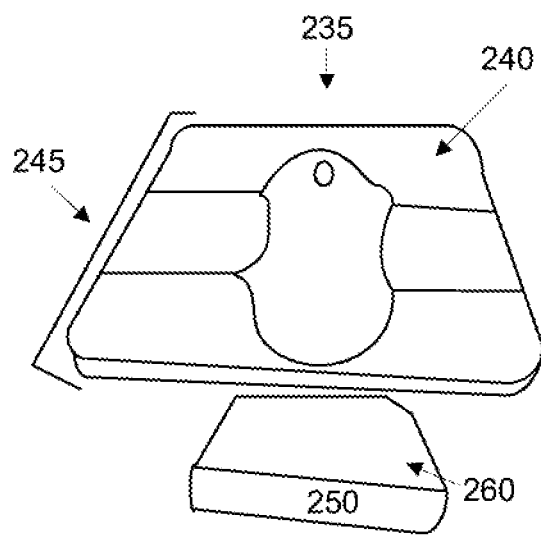
FIG. 2F is an illustration of a contact pad and a chip according to an example embodiment.

As illustrated in FIG. 2F, the one or more connections 255 of card 235, as previously depicted in FIG. 2E, have been severed due to the removal by one or more structures 265 as explained above with reference to FIG. 2E. FIG. 2F may reference the same or similar components of card 235 as previously described with reference to FIG. 2E.

Figure 3A:
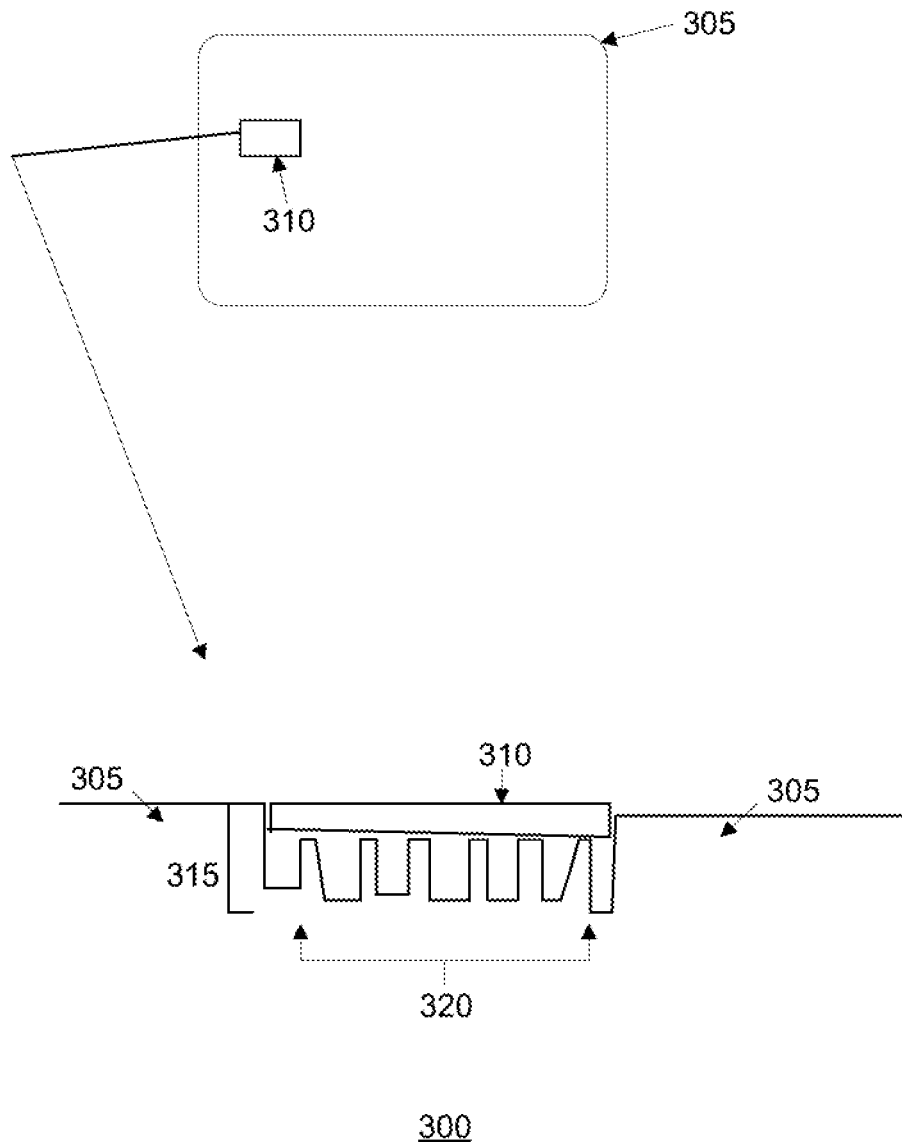
FIG. 3A is an illustration of a cross-sectional view of a chip pocket and a chip according to an example embodiment.

As illustrated in FIG. 3A, system 300 depicts a schematic of cross-sectional view of a chip pocket of a card. FIG. 3A may reference the same or similar components as illustrated in FIGS. 2A-2F, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3A, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although seven types of peaks and valleys are illustrated in FIG. 3A, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3A depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3B:
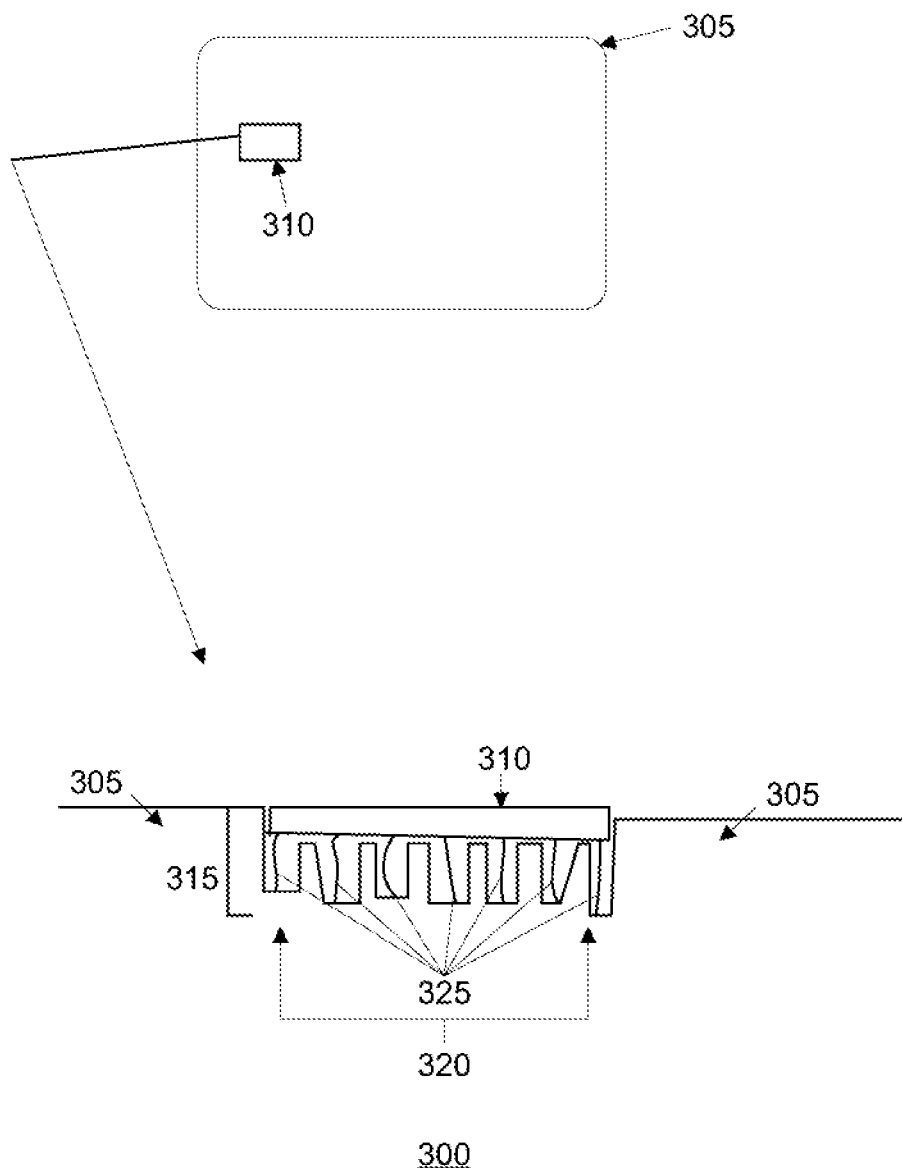
FIG. 3B is an illustration of a cross-sectional view of a chip pocket and a chip according to an example embodiment.

FIG. 3B illustrates another example embodiment of the system 300 shown in FIG. 3A, including a card 305, a chip 310, a chip pocket 315, and one or more peaks and one or more valleys 320 that may comprise one or more air gaps. As shown in FIG. 3B, one or more connections 325, which may comprise one or more leads, wires or pins, or any combination thereof, may be communicatively coupled to at least a portion of the chip 310. The one or more connection 325 may be disposed between the one or peaks and one or more valleys 320. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more leads between the one or peaks and one or more valleys 320 may increase the difficulty of removing the chip and reduce the likelihood that chip fraud may be committed.

Figure 3C:
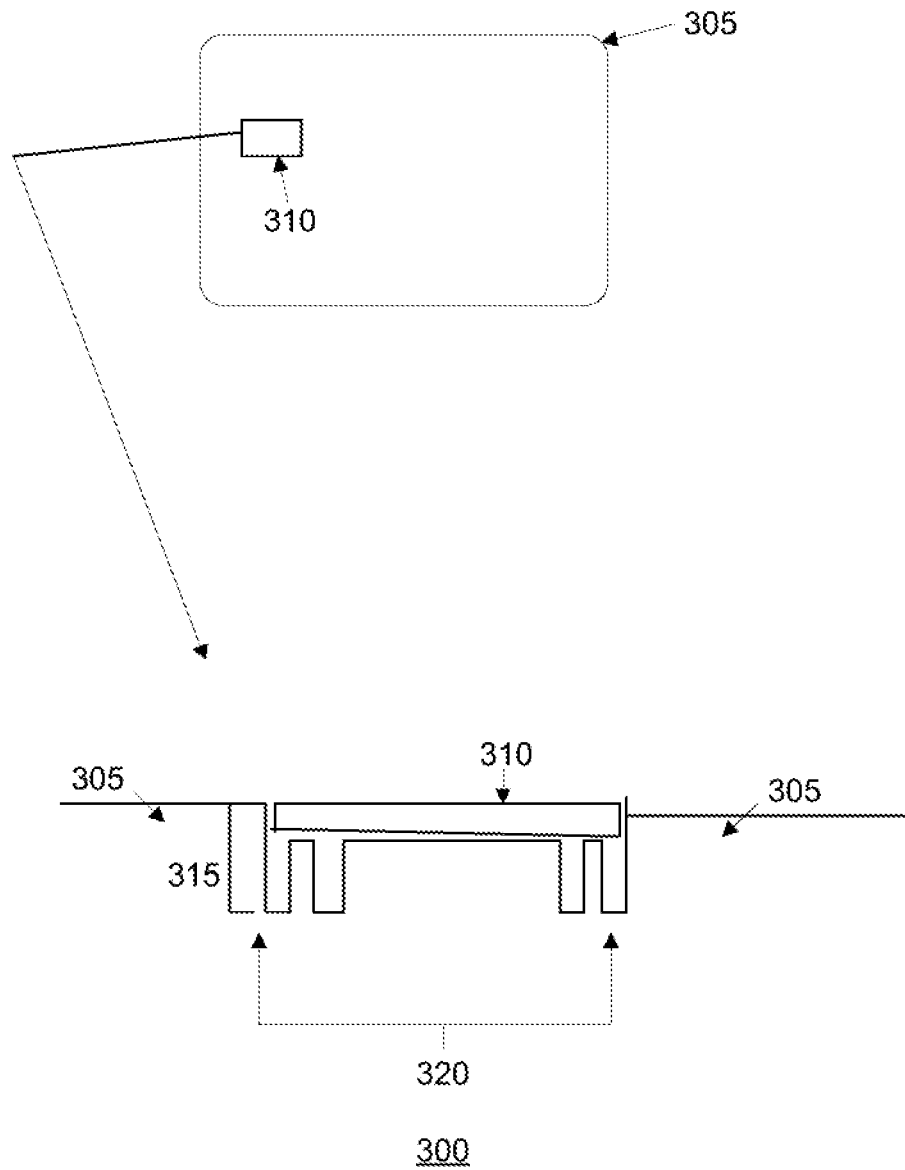
FIG. 3C is an illustration of a cross-sectional view of a chip pocket and a chip according to an example embodiment.

As illustrated in FIG. 3C, system 300 depicts a schematic of cross-sectional view of a chip pocket of a card. FIG. 3C may reference the same or similar components as illustrated in FIGS. 3A-3B, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3C, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although three peaks and four valleys are illustrated in FIG. 3C, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3C depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3D:
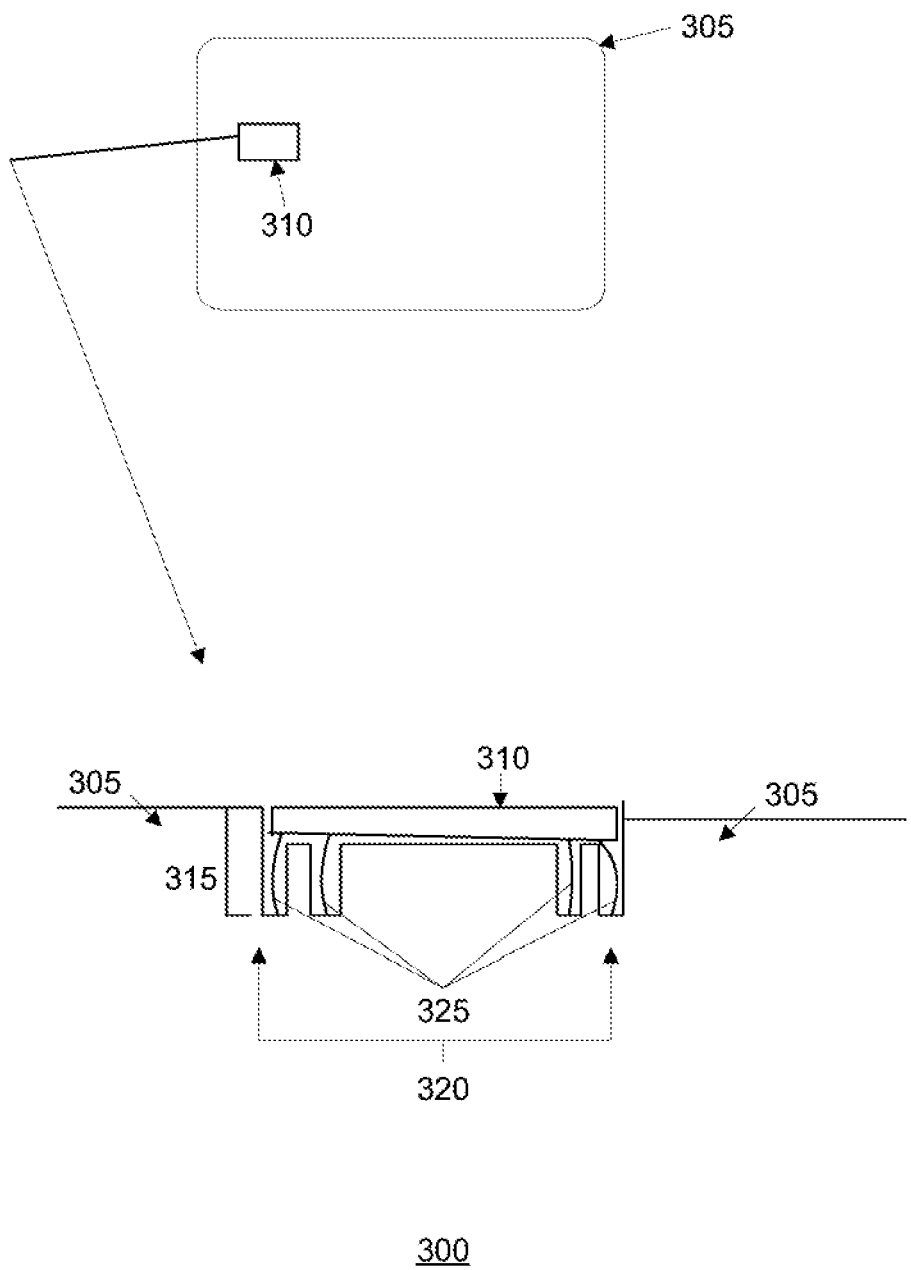
FIG. 3D is an illustration of a cross-sectional view of a chip pocket and a chip according to an example embodiment.

FIG. 3D illustrates another example embodiment of the system 300 shown in FIG. 3C, including a card 305, a chip 310, a chip pocket 315, and one or more peaks and one or more valleys 320 that may comprise one or more air gaps. As shown in FIG. 3D, one or more connections 325, which may comprise one or more leads, wires or pins, or any combination thereof, may be communicatively coupled to at least a portion of the chip 310. The one or more connection 325 may be disposed between the one or peaks and one or more valleys 320. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more leads between the one or peaks and one or more valleys 320 may increase the difficulty of removing the chip and reduce the likelihood that chip fraud may be committed.

Figure 3E:
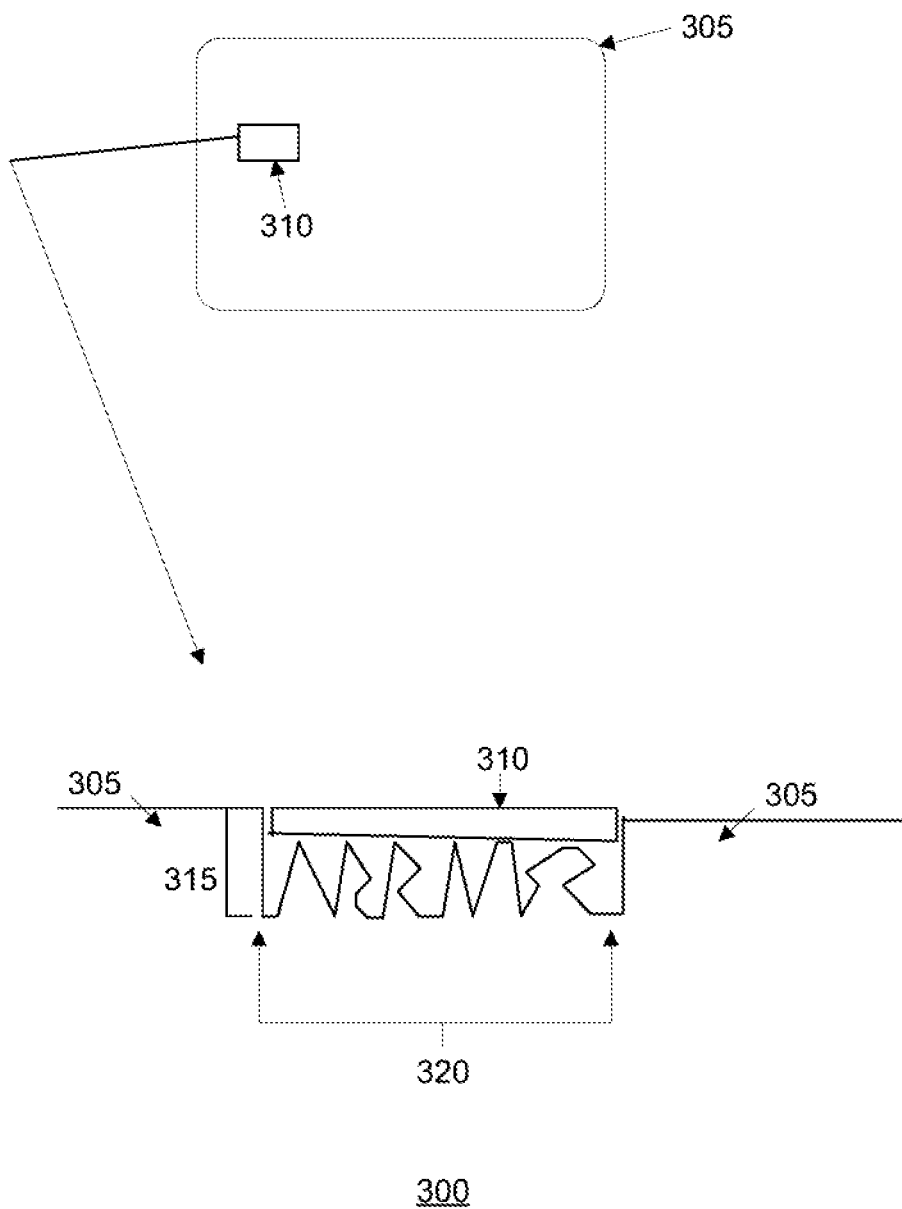
FIG. 3E is an illustration of a cross-sectional view of a chip pocket and a chip according to an example embodiment.

As illustrated in FIG. 3E, system 300 depicts a schematic of cross-sectional view of a chip pocket of a card. FIG. 3E may reference the same or similar components as illustrated in FIGS. 3A-3D, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3E, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although three peaks and four valleys are illustrated in FIG. 3E, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3E depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3F:
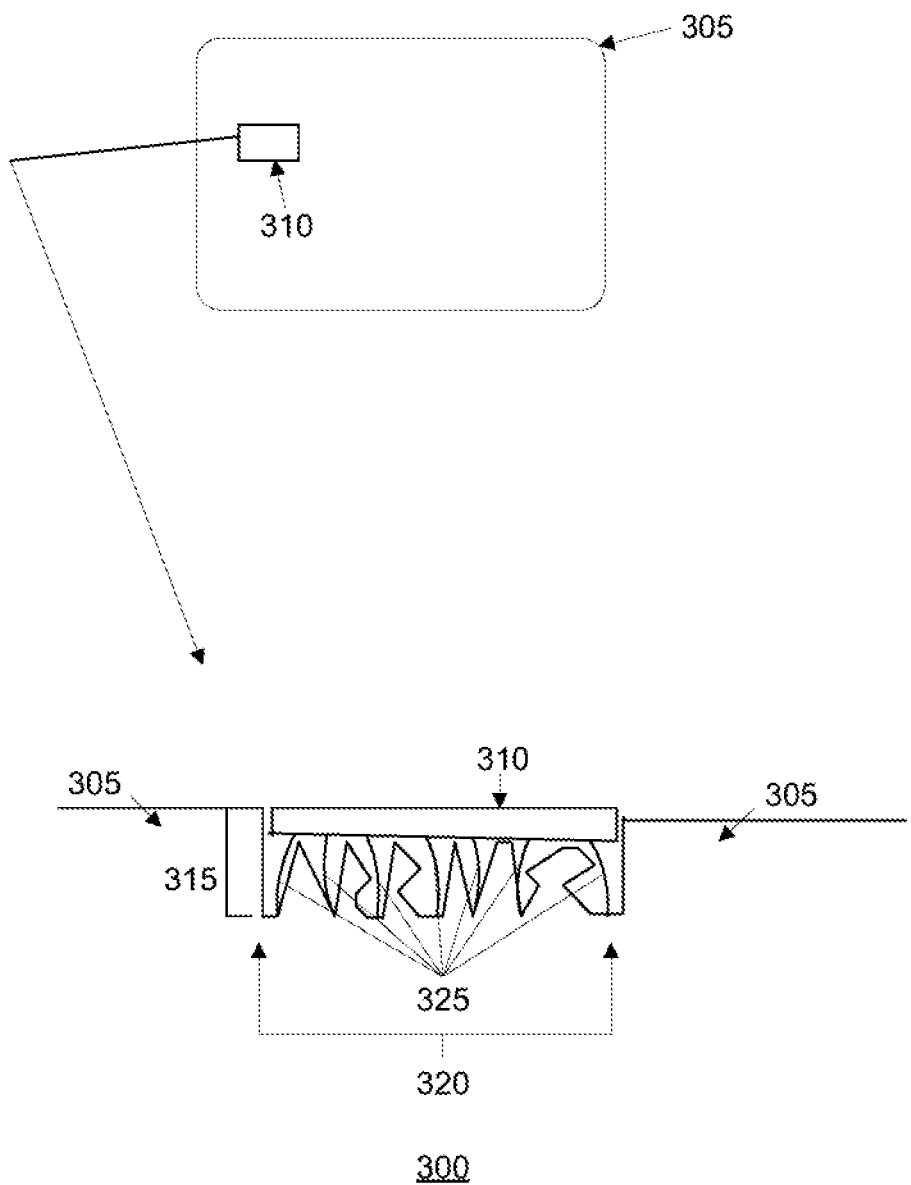
FIG. 3F is an illustration of a cross-sectional view of a chip pocket and a chip according to an example embodiment.

FIG. 3F illustrates another example embodiment of the system 300 shown in FIG. 3E, including a card 305, a chip 310, a chip pocket 315, and one or more peaks and one or more valleys 320 that may comprise one or more air gaps. As shown in FIG. 3F, one or more connections 325, which may comprise one or more leads, wires or pins, or any combination thereof, may be communicatively coupled to at least a portion of the chip 310. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more leads between the one or peaks and one or more valleys 320 may increase the difficulty of removing the chip and reduce the likelihood that chip fraud may be committed.

Figure 3G:
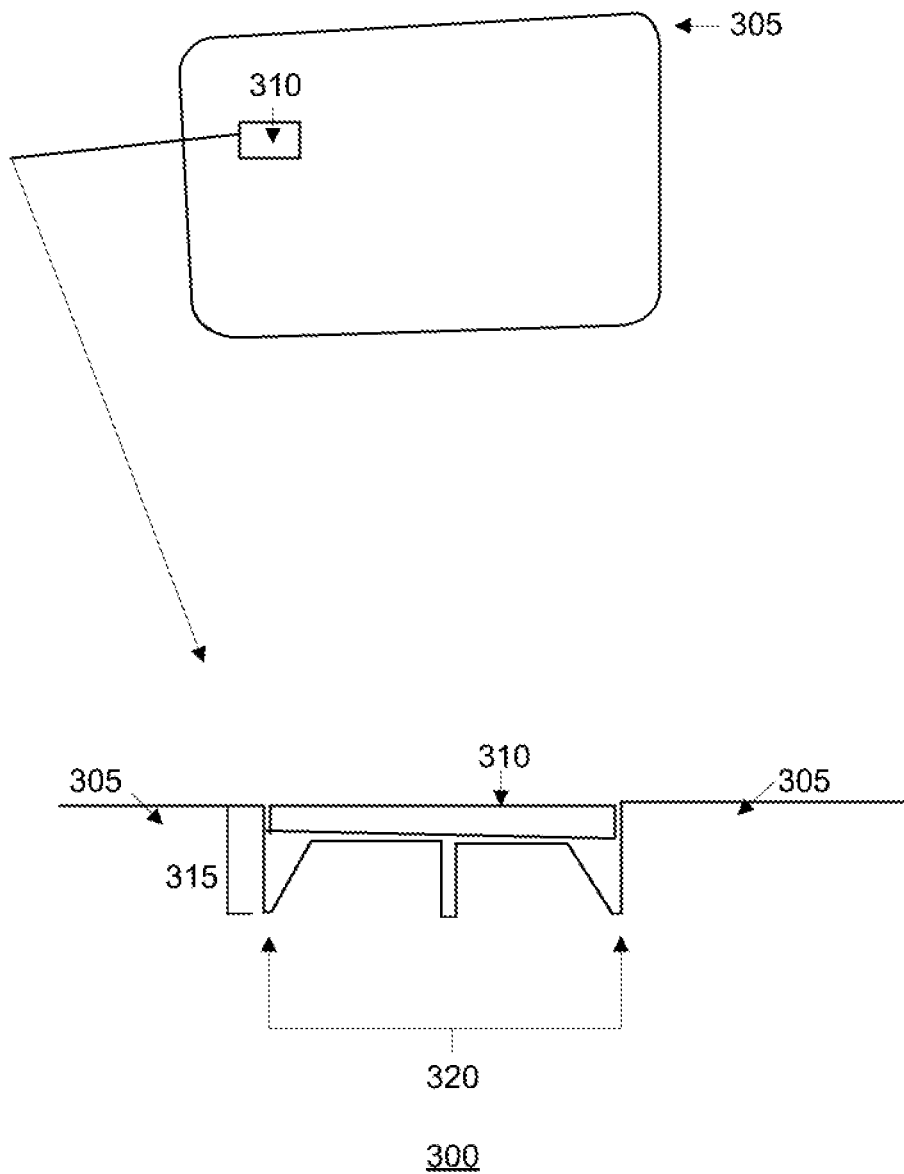
FIG. 3G is an illustration of a cross-sectional view of a chip pocket and a chip according to an example embodiment.

As illustrated in FIG. 3G, system 300 depicts a schematic of cross-sectional view of a chip pocket of a card. FIG. 3G may reference the same or similar components as illustrated in FIGS. 3A-3F, such as a card, one or more connections, and a chip. Card 305 may comprise a chip 310 that is at least partially or wholly positioned on or at least partially or wholly encompassed or at least partially or wholly integrated within a housing or reservoir, the housing or reservoir comprising a chip pocket 315. In some examples, the one or more peaks and one or more valleys 320 may comprise one or more air gaps. In some examples, the one or more peaks and one or more valleys 320 may comprise one or more tapered or jagged edges. Although single instances of the chip 310 are depicted in FIG. 3G, one or more chips 310 of card 305 may be at least partially or wholly positioned on or at least partially or wholly encompassed or at least partially or wholly integrated within one or more housings or reservoirs.

In some examples, the one or more peaks and one or more valleys 320 of the chip pocket 315 may be generated or designed via a saw tooth milling pattern. The saw tooth milling pattern may be programmed or machined by a machine (not shown). In contrast to a smooth milling pattern, the saw tooth milling pattern for the chip pocket 315 or a derivation of the saw tooth milling pattern, makes it difficult to attempt removal and/or remove the chip 310 from the card 305. Thus, the saw tooth milling pattern promotes the success of adhesion of the chip 310 to the chip pocket 315 while also creating an uneven cutting process to prevent removal of the chip 310. In addition, one or more adhesives may be applied within the air gaps between the one or more peaks and one or more valleys 320 (e.g., to completely or partially fill the air gaps), which may strengthen the adhesion of the chip 310 within the chip pocket 315. As a consequence of this removal prevention design, removal of the chip may be more difficult and chip fraud may be reduced.

In some examples, each of the one or more peaks and one or more valleys 320 of the chip pocket 315 may comprise same or different shapes, lengths, and/or dimensions so as to produce one or more arrangements of the one or more shapes. For example, although two peaks and three valleys are illustrated in FIG. 3G, fewer or greater peaks and valleys may be included, and other types of peaks and valleys 320 may comprise one or more angled and/or curved portions. Accordingly, one or more peaks and one or more valleys 320 may comprise different or irregular shapes, lengths, and/or dimensions. In some examples, one or more subsets of the one or more peaks and the one or more valleys 320 may be generated or repeated after a predetermined interval, or one or more subsets of the one or more peaks and one or more valleys 320 may generated or repeated at random, as determined by one or more machining processes. Although FIG. 3G depicts the card 305, chip 310, one or more connections 320, and one or more peaks and one or more valleys 320, different variations may be used within a given card 305 issuance, such that the same card issued by an institution may have a number of different patterns based on the particular card 305 that is prepared for the user. In the event the user misplaces their card 305, a new card may be issued with an entirely different pattern to replace the previous card.

Figure 3H:
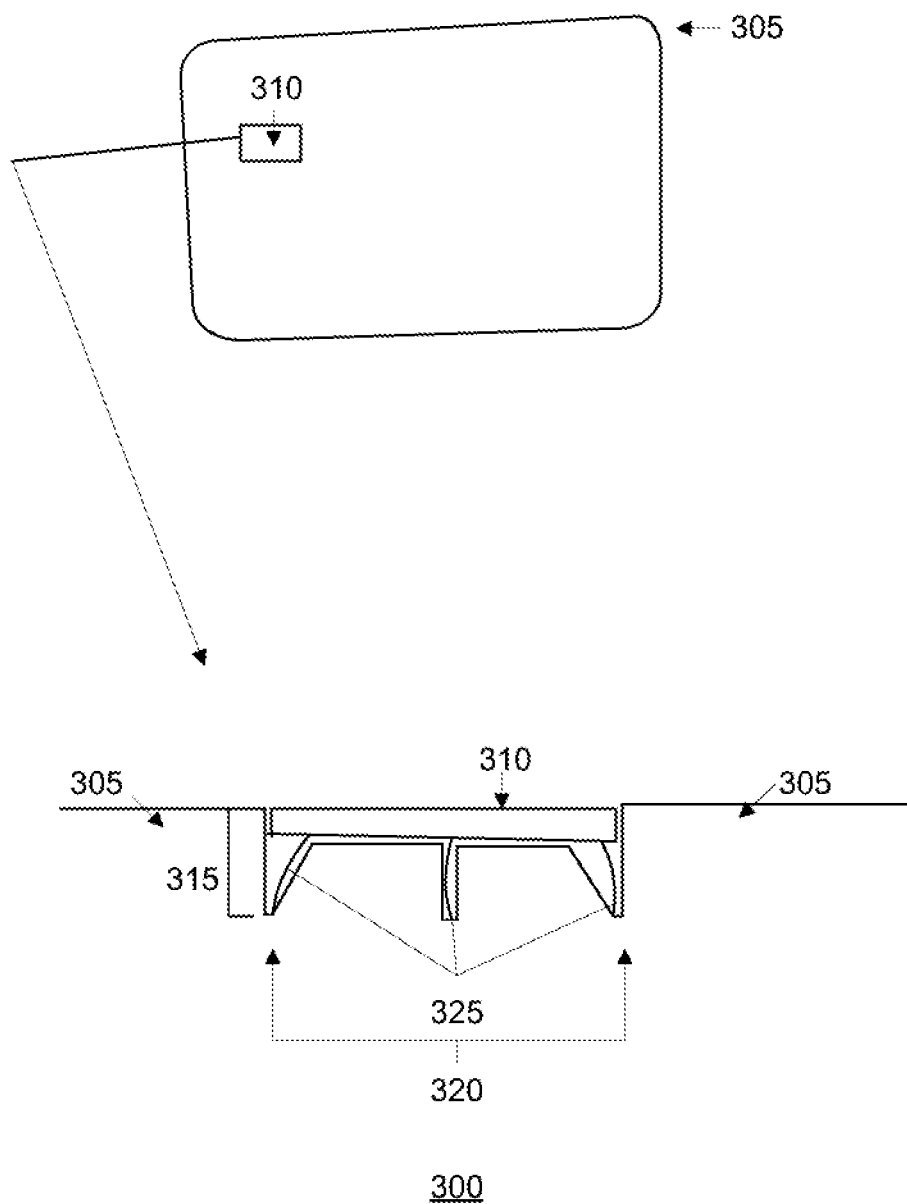
FIG. 3H is an illustration of a cross-sectional view of a chip pocket and a chip according to an example embodiment.

FIG. 3H illustrates another example embodiment of the system 300 shown in FIG. 3H, including a card 305, a chip 310, a chip pocket 315, and one or more peaks and one or more valleys 320 that may comprise one or more air gaps. As shown in FIG. 3H, one or more connections 325, which may comprise one or more leads, wires or pins, or any combination thereof, may be communicatively coupled to at least a portion of the chip 310. In some examples, the one or more connections 325 may be disposed within air gaps between the one or peaks and one or more valleys 320. In other examples, the one or more connections 325 may be disposed within the adhesive that may completely or partially fill the air gaps. In either case, if any of the one or more connections 325 are severed during an attempt to remove the chip 310, the chip 310 may not properly function. Accordingly, disposing the one or more connections 325 between the one or peaks and one or more valleys 320 may increase the difficulty of removing the chip and reduce the likelihood that chip fraud may be committed.

Figure 4A:
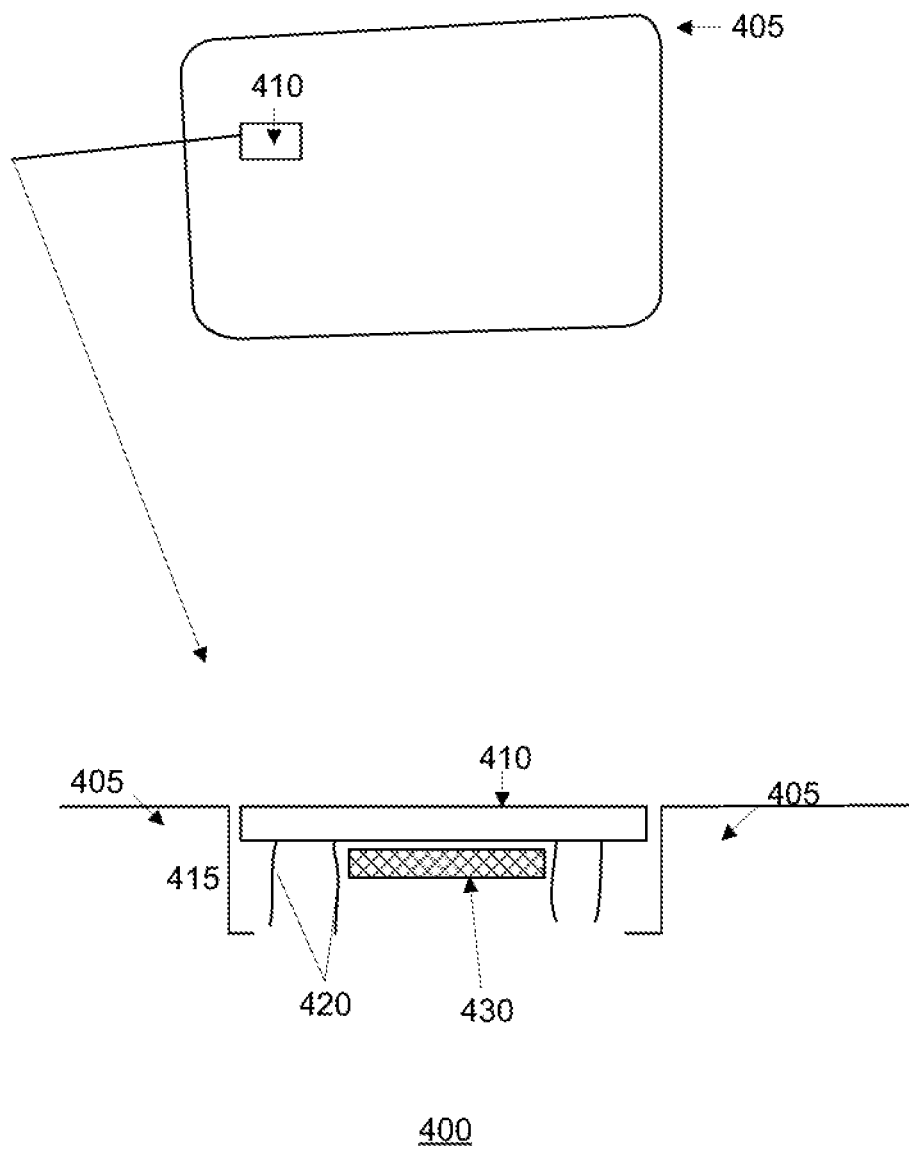
FIG. 4A is an illustration of a cross-sectional view of a chip pocket, a chip, and a capacitance member according to an example embodiment.

FIG. 4A illustrates a system 400 according to an example embodiment. FIG. 4A depicts a schematic of cross-sectional view of a chip pocket of a card. FIG. 4A may reference same or similar components as illustrated in FIGS. 1-3D, such as a card, one or more connections, and a chip. Card 405 may comprise a chip 410 that is at least partially or wholly positioned on or at least partially or wholly encompassed or at least partially or wholly integrated within a housing or reservoir, the housing or reservoir comprising a chip pocket 415. FIG. 4A depicts a fraud prevention capacitance member 430. Capacitance member 430 may be at least partially or wholly disposed within the chip pocket 415. One or more connections 420 may be communicatively coupled to at least a portion, such as a surface, of the chip 410. Although single instances of the chip 410 and capacitance member 430 are depicted in FIG. 4A, one or more chips 410 or capacitance members 430 of card 405 may be at least partially or wholly positioned on or at least partially or wholly encompassed or at least partially or wholly integrated within one or more housings or reservoirs.

Capacitance members 430 may comprise any material with a measureable and/or detectable capacitance value. In some embodiments, capacitance member 430 comprises a metal and/or metal alloy. It will be appreciated that the capacitance value associated with a capacitance member 430 depends, at least in part on the materials of the capacitance member 430.

Capacitance member 430 may be any dimensions or form-factor. In some embodiments, capacitance member may comprise one or more wires, coils, plates, discs, cubes, particles, flakes, and/or combinations thereof. It will be appreciated that the capacitance value associated with a capacitance member 430 depends, at least in part, on the dimensions and configuration of the capacitance member 430.

In some embodiments, chip 410 comprises a memory containing an applet. The capacitance member 430 may be in data communication with the chip 415 and the applet may be configured to measure or determine a capacitance value of the capacitance member 430. In some embodiments, the applet measures the capacitance value of the capacitance member 430 prior to performing an operation such as, for example, authorizing a transaction.

Each capacitance member 430 comprises a capacitance value based on the materials, dimensions, and configuration of the capacitance member. If the chip 410 is separated from the capacitance member 430 the applet is able to detect this separation. The capacitance value of the capacitance member 430 may be measured with a high degree of precision such that duplicating a capacitance member with the same capacitance value is presents a significant challenge.

In some embodiments, when a chip 410 is initially activated, the chip 410 may detect the initial capacitance value of the capacitance member 430 to which the chip 410 is initially connected. The chip and/or an applet contained within a memory on the chip, may then be configured to measure the capacitance value of the capacitance member 430 prior to authorizing operations. This arrangement allows for a chip 410 to be married to a specific capacitance member 430 when the chip is initially activated. The chip 410 may also be configured to deny operations and/or issue a fraud alert if the chip 410 is ever removed from the specific capacitance member 430 to which the chip 410 is initially married.

Figure 4B:
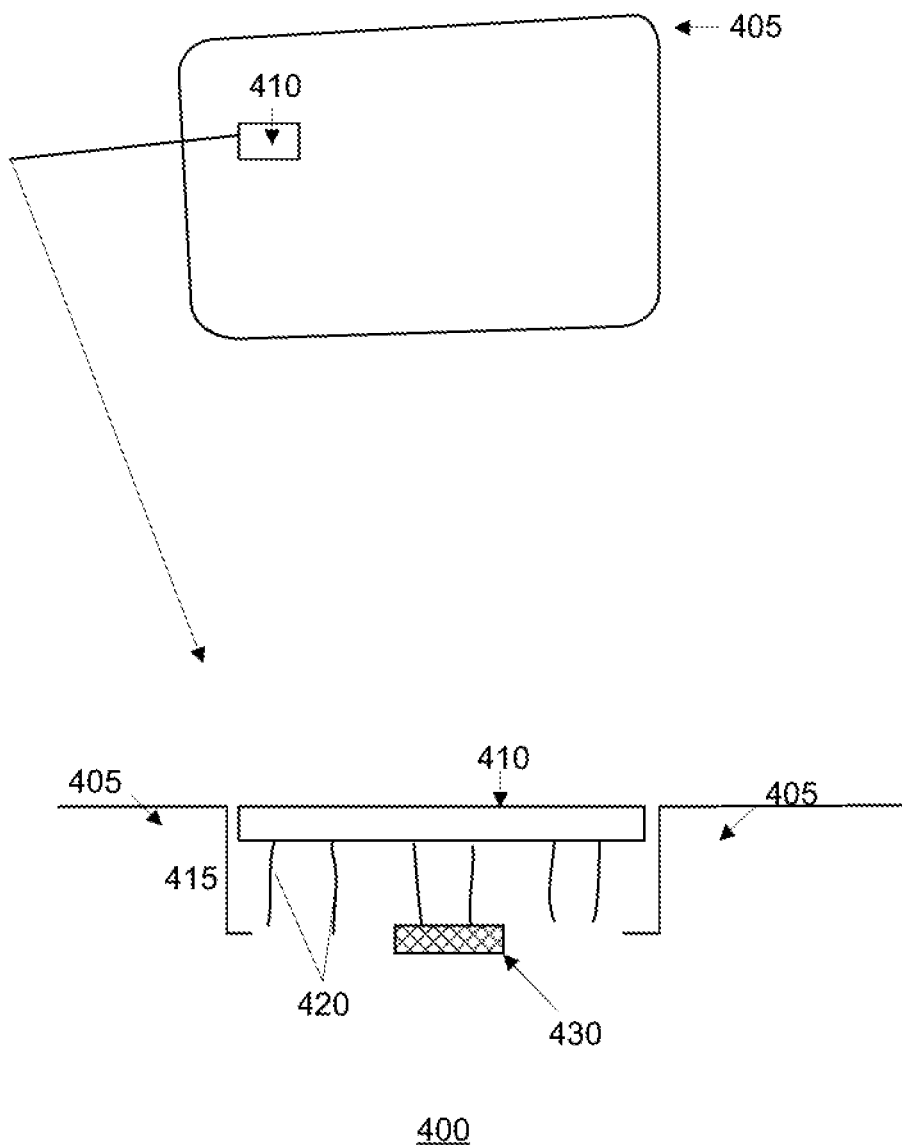
FIG. 4B is an illustration of a cross-sectional view of a chip pocket, a chip, and a capacitance member according to an example embodiment.

FIG. 4B illustrates a system 400 according to an example embodiment. FIG. 4B depicts a schematic of cross-sectional view of a chip pocket of a card. FIG. 4B may reference same or similar components as illustrated in FIGS. 1-4A, such as a card, one or more connections, and a chip.

As depicted in FIG. 4B, in some embodiments, the chip 410 may be in data communication with the capacitance member 430 through one or more connections 420. In some embodiments, the capacitance member 430 may be arranged to be separated from the chip upon contact with a structure configured to remove one or more connections 420. If a fraudster attempts to remove the chip 410 from the card 405, the fraudster is likely to damage or break a connection 420 that is necessary for the applet to measure the capacitive value of the capacitive member 430. If the applet is unable to measure the capacitive value of the capacitive member 430, the applet may deny any future transactions.

Figure 4C:
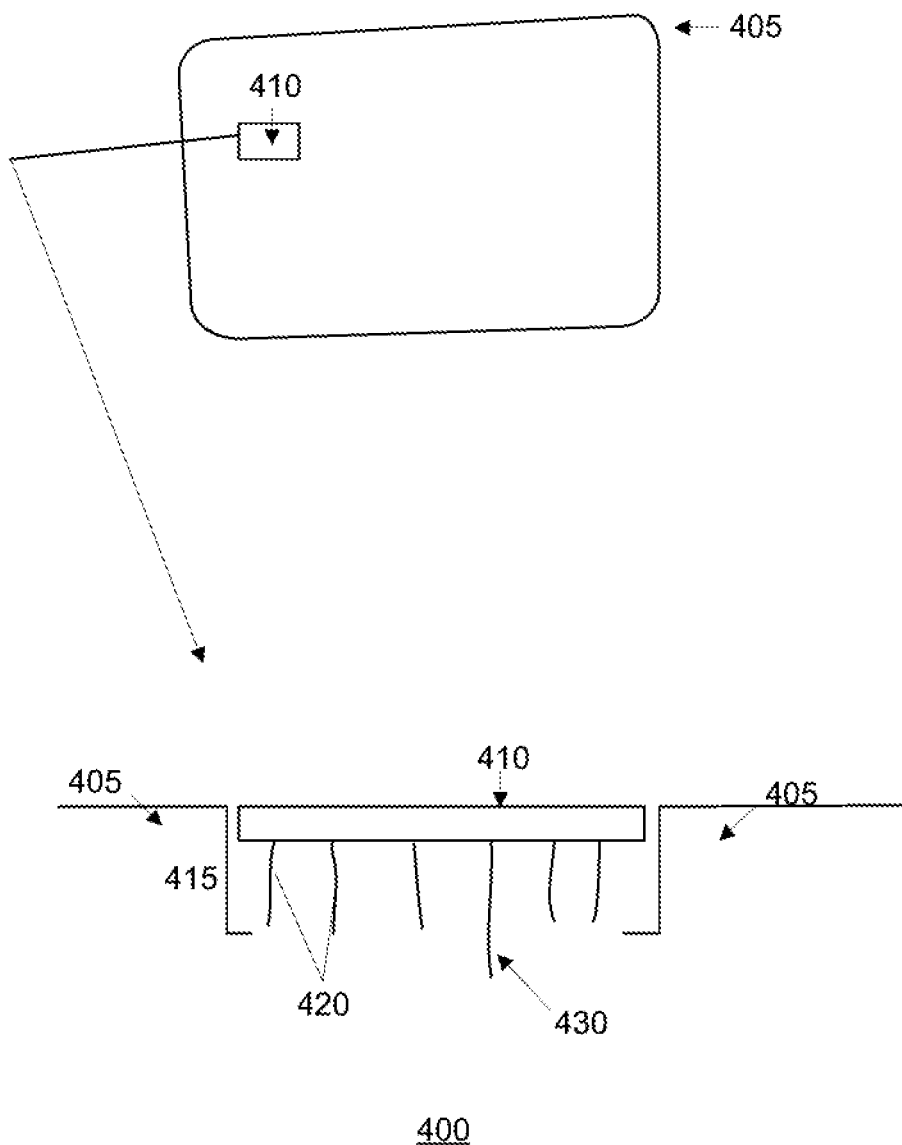
FIG. 4C is an illustration of a cross-sectional view of a chip pocket, a chip, and a capacitance member according to an example embodiment.

FIG. 4C illustrates a system 400 according to an example embodiment. FIG. 4C depicts a schematic of cross-sectional view of a chip pocket of a card. FIG. 4C may reference same or similar components as illustrated in FIGS. 1-4B, such as a card, one or more connections, and a chip.

As depicted in FIG. 4C, in some embodiments, the capacitive member 430 is a wire. In some embodiments, a first end of the capacitance wire may be in communication with is in data communication with the chip. In some embodiments, a second end of the capacitance wire may be secured within the chip pocket. If a second end of the capacitance wire is secured within the chip pocket, a fraudster will face significant challenges when attempting to remove the chip and/or capacitance wire without damaging or altering the capacitance of the capacitance wire. Additionally, the capacitance wire will be difficult or impossible to install in a different card without altering the capacitance value of the capacitance wire. If the applet detects a chance in the capacitance value of the capacitance wire, the applet may be configured to issue a fraud notification.

Figure 4D:
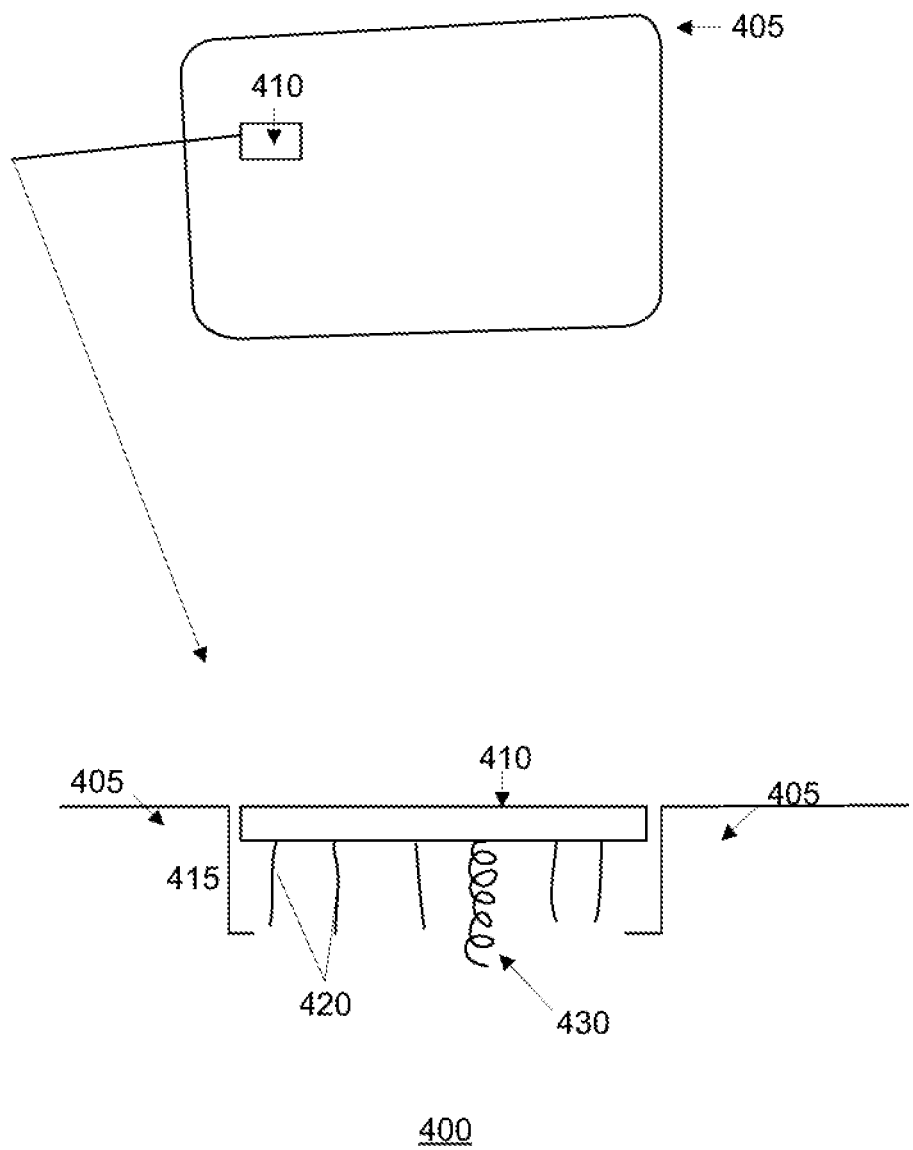
FIG. 4D is an illustration of a cross-sectional view of a chip pocket, a chip, and a capacitance member according to an example embodiment.

FIG. 4D illustrates a system 400 according to an example embodiment. FIG. 4D depicts a schematic of cross-sectional view of a chip pocket of a card. FIG. 4D may reference same or similar components as illustrated in FIGS. 1-4C, such as a card, one or more connections, and a chip.

As depicted in FIG. 4D, in some embodiments, the capacitive member 430 is a coil. In some embodiments, a first end of the capacitance coil may be in communication with is in data communication with the chip. In some embodiments, a second end of the capacitance coil may be secured within the chip pocket, thereby making removal of the chip and/or capacitive coil difficult without altering the capacitive value of the capacitive coil.

In some embodiments, the capacitive coil may be a spring that is configured to apply a force to the surface of the chip. A capacitive coil or capacitive spring may be compressed when the capacitive coil or spring is initially installed. The initial capacitive value determined by the chip may reflect the degree and/or nature of compression of the capacitive coil or spring.

In some embodiments, the capacitive spring may apply a force to the chip and/or chip pocket. The chip may be secured in place, thereby containing the compressed capacitive spring, using an adhesive. In such embodiments, if the adhesive securing the chip to the card is damaged, the compressed capacitive spring my force the chip away from the card in a manner that is designed to damage one or more connections or capacitive members. In such embodiments, an attempt to remove a chip from a card would likely result in damage to the chip, connections, and/or capacitive members. An applet contained within the memory of the chip may be configured to issue a fraud notice if it detects damage to any connections or changes to a capacitive member.

Figure 5:
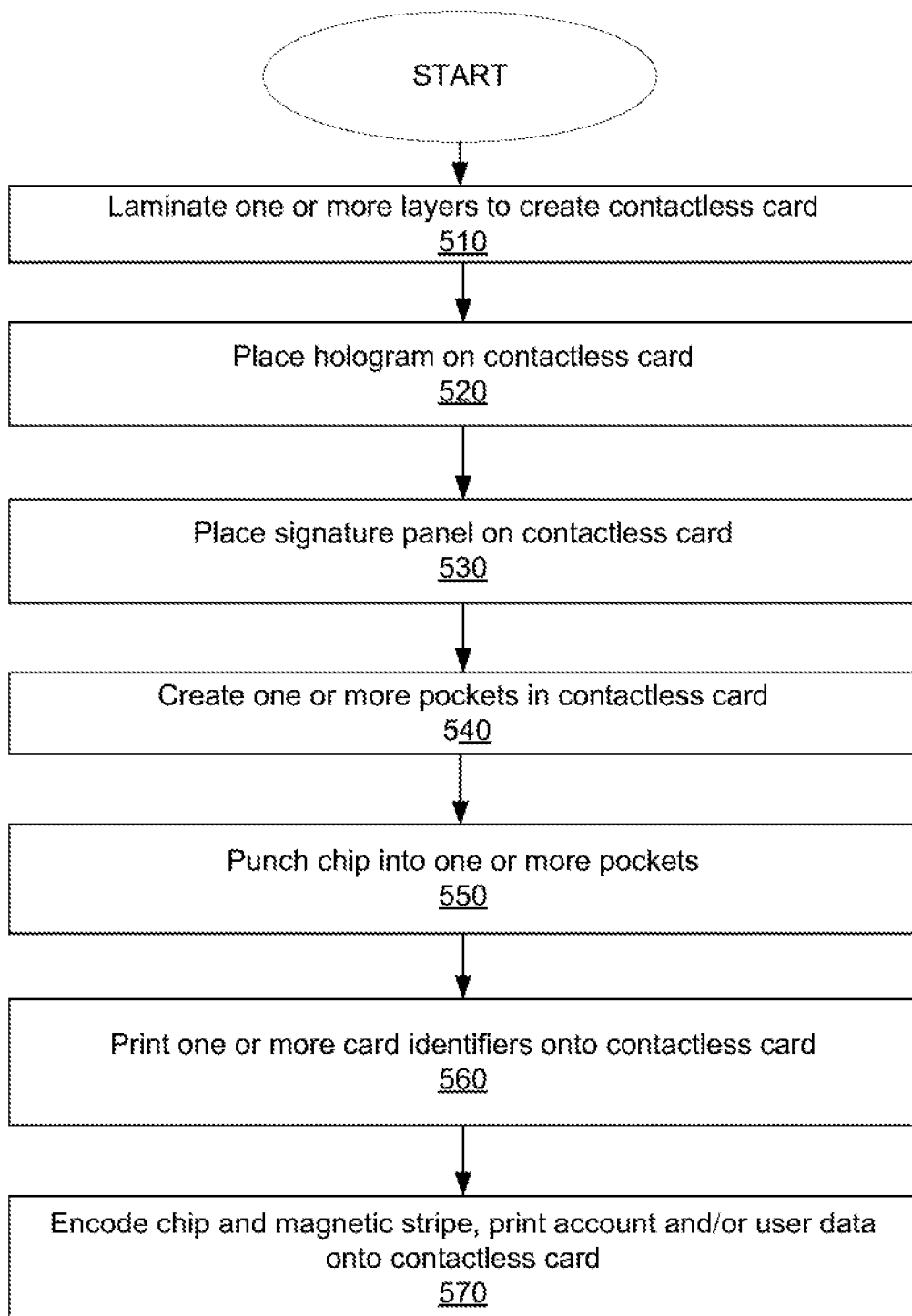
FIG. 5 illustrates a method of making a card according to an example embodiment.

FIG. 5 illustrates a method 500 of making a card. FIG. 5 may reference the same or similar components of FIGS. 1-4, as explained above.

At block 510, method may comprise laminating one or more layers together. In some examples, the one or more layers may comprise an outermost or exterior layer which includes a layer that receives paint, ink, or laser treatment. The outermost or exterior layer may comprise the ceiling or top layer of the one or more laminated layers. The outermost or exterior layer may comprise a thin film that receives laser personalization. In some examples, the laser personalization may comprise custom laser personalization.

The one or more layers may further comprise one or more artwork layers positioned below the outermost or exterior layer. For example, the one or more artwork layers may comprise personalized information about the user and/or financial institution that issues the card.

The one or more layers may further comprise one or more metal core layers positioned below the one or more artwork layers.

The one or more layers may comprise one or more magnetic stripe layer positioned below the one or more metal core layers. In some examples, the one or more magnetic stripe layers may comprise the innermost or interior layer of the card.

In some examples, the one or more layers may be arranged in one or more sheets. By way of an example, each sheet may comprise a plurality of cards. In some examples, one or more sheets may comprise 50 or more cards. The one or more sheets may be fed to a laminating press which is configured to laminate the one or more layers together. In some examples, the lamination process may comprise hot lamination or cold lamination. At this point, the card includes the one or more layers, and does not yet include personal information, a signature panel, a hologram, and a chip.

At block 520, a hologram may be placed on the card. In some examples, the hologram may comprise a secure hologram, and the hologram may be placed on an area of the card. In some examples, the hologram may be placed on a secure area of the card that may be checked by a merchant.

At block 530, a signature panel may be placed on the card. In some examples, the signature panel may be heat stamped onto a portion the card. The signature panel may also be checked by a merchant. The signature panel may be placed on a portion of the card, such as the back of the card.

At block 540, the card may be transferred to one or more machines. The one or more machines may comprise a stamping machine and may be configured to mill one or more chip pockets and embed a chip into the card. In some examples, the card may comprise a chip that is at least partially or wholly positioned on or at least partially or wholly encompassed or at least partially or wholly integrated within a housing or reservoir, the housing or reservoir comprising a chip pocket. As further discussed below, one or more connections may communicatively couple at least a portion, such as a surface, of the chip which may be at least partially or wholly disposed on one or more peaks and one or more valleys of the chip pocket. In some examples, the one or more peaks and one or more valleys may comprise one or more air gaps. In some examples, the one or more peaks and one or more valleys may comprise one or more tapered or jagged edges.

In some examples, the one or more peaks and one or more valleys of the chip pocket may be generated or designed via a saw tooth milling pattern. The saw tooth milling pattern may be programmed or machined by a machine. In contrast to a smooth milling pattern, the saw tooth milling pattern for the chip pocket and one or more connections, or a derivation of the saw tooth milling pattern, makes it difficult to attempt removal and/or remove the chip from the card. Thus, the saw tooth milling pattern promotes the success of adhesion of the chip to the chip pocket while also creating an uneven cutting process to prevent removal of the chip. As a consequence of this removal prevention design, chip fraud is eliminated.

In some examples, each of the one or more peaks and one or more valleys of the chip pocket may comprise same or different shapes, lengths, and/or dimensions so as to produce one or more arrangements of the one or more shapes. Accordingly, one or more connections may comprise different or irregular shapes, lengths, and/or dimensions. In some examples, one or more subsets of the one or more peaks and the one or more valleys may be generated or repeated after a predetermined interval, or one or more subsets of the one or more peaks and one or more valleys may generated or repeated at random, as determined by one or more machining processes. For example, one or more peaks and one or more valleys may be included, and other types of peaks and valleys may comprise one or more angled and/or curved portions. Different variations may be used within a given card issuance, such that the same card issued by an institution may have a number of different patterns based on the particular card that is prepared for the user. In the event the user misplaces their card, a new card may be issued with an entirely different pattern to replace the previous card.

In some examples, the chip may comprise an integrated circuit. In one example, card may include a planar surface comprising a substrate, and a chip embedded or integrated or otherwise in communication with card via one or more electronic components or connections. For example, the one or more connections may comprise one or more leads, wires or pins, or any combination thereof, communicatively coupled to chip. One or more connections may be configured to connect a surface of the chip. The surface may comprise an exterior region of chip, and the chip may project outwards from card to depict its connectivity.

In another example, the card may include a chip embedded or integrated or otherwise in communication with card via one or more electronic components or connections. For example, one or more connections may comprise one or more wires or pins, or any combination thereof, communicatively coupled to chip. One or more connections may be configured to connect a surface of the chip. The surface may comprise an interior region of chip, and the chip may be project outwards from the card to depict its connectivity.

At block 550, after the one or more chip pockets are created for housing the chip, the one or more machines may be configured to punch the chip into the one or more chip pockets. In some examples, other machines may be used in lieu of the stamping machine to punch the chip into the one or more chip pockets.

At block 560, the chip may include MasterCard or Visa information. At this point, no other information exists within the chip, such as card information or to whom the card is assigned to. The card may be associated with one or more card identifiers. In some examples, the one or more card identifiers may be printed adjacent to a corner of the card; however, other regions of the card may be used for display of the one or more card identifiers.

At block 570, the card may be sent to a vault or facility, such as a personalization facility, and the card is ready for pick up. One or more machines within the vault or facility may request the card based on the one or more card identifiers. The one or more machines may receive the card based on the one or more card identifiers and may perform encoding of the magnetic stripe; printing of data, such as account number information and user information, including first and last name, on the front and/or back of the card; encoding of the chip. For example, the card may comprise identification information displayed on the front and/or back of the card, and a contact pad. In some examples, the identification information may comprise one or more of cardholder name and expiration date of the card. The card may also include a magnetic stripe or tape, which may be located on the back of the card.

Figure 6:
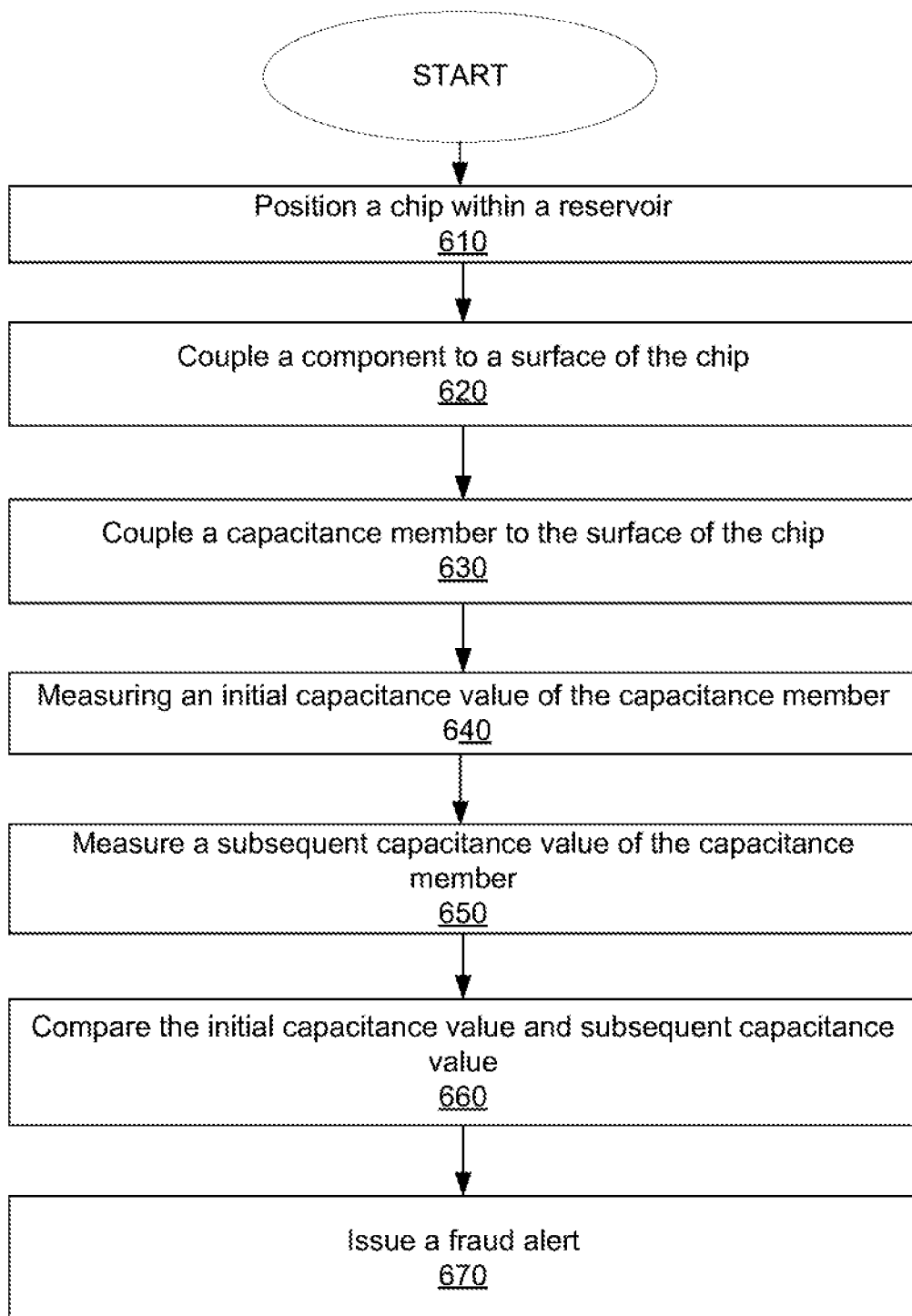
FIG. 6 illustrates a method of making a device with a capacitance member according to an example embodiment.

FIG. 6 illustrates a method 600 of making a card. FIG. 6 may reference same or similar components of FIGS. 1-5, as explained above.

At block 610, method 600 may comprise positioning a chip of a device in a reservoir. The chip may comprise a memory containing an applet. The chip may be secured and/or adhered in position after it is originally positioned within the reservoir. Additionally, any connections or capacitance members may be secured to the reservoir or surface of the chip prior to securing the chip in place.

At block 620, method 600 comprises coupling a component, such as an electrical connection or wire to the surface of the chip. In embodiments in which the chip is positioned under a contact pad, the components may provide data communication between the contact pad and the chip. In some embodiments, the components may be coupled to the lower surface of the chip and secured within the reservoir.

At block 630, method 600 comprises coupling a capacitance member to the surface of the chip. The capacitance member may be one or more wires, coils, plates, discs, cubes, particles, flakes, and/or combinations thereof. In some embodiments, a capacitive plate may be coupled to the chip using a connection. In some embodiments, the capacitive member may be coupled to the chip using an electrically conductive adhesive.

At block 640, method 600 comprises measuring an initial capacitance value of the capacitance member. In some embodiments, the chip comprises a memory containing an applet. The applet may be configured to measure an initial capacitance value of the capacitance member as the precise capacitance value of the capacitance member may be difficult to determine prior to coupling the capacitance member to the chip. Additionally, the capacitance value of some capacitance members may change as the chip is positioned and/or secured within the reservoir. Once the chip and capacitance member are in their finished configurations, the applet may measure an initial capacitance value and use that value as a baseline for subsequent measurements to detect fraudulent activity.

At step 650, method 600 comprises measuring a subsequent capacitance value of the capacitance member. At step 660, method 600 comprises comparing the initial capacitance value and the subsequent capacitance value. The applet may be configured to compare the initial and subsequent capacitance values to detect fraudulent activity. In some embodiments, the applet may be configured to disregard a difference of capacitance values that is within a predetermined amount as the capacitance value of the capacitance member may change slightly if the device, such as, for example, a card, containing the chip and capacitance member is flexed during normal use. In some embodiments, the applet may be configured to update a baseline capacitance value is the subsequently measured capacitance values continuously changes in steady fashion over time. In some embodiments, this may indicate normal wear-and-tear rather than fraudulent activity.

At step 670, method 600 comprises issuing a fraud alert based on a determined difference between a subsequently measured capacitance value and the initially measured capacitance value or a baseline capacitance value. If the applet determines a change in capacitance value greater than a predetermined acceptable amount, the applet may determine that fraudulent activity has occurred such as, for example, a fraudster attempting to remove the chip from a card.

In some embodiments, the chip and/or reservoir may comprise one or more shape such as, for example, peaks and/or valleys, formed in a saw tooth milling pattern. In some examples, the components, connections and capacitance members coupled or otherwise secured to the chip may be placed between the peaks or valleys to further frustrate any attempt to remove a chip from a card without damaging the capacitance member or other components and triggering a fraud alert.

Figure 7:
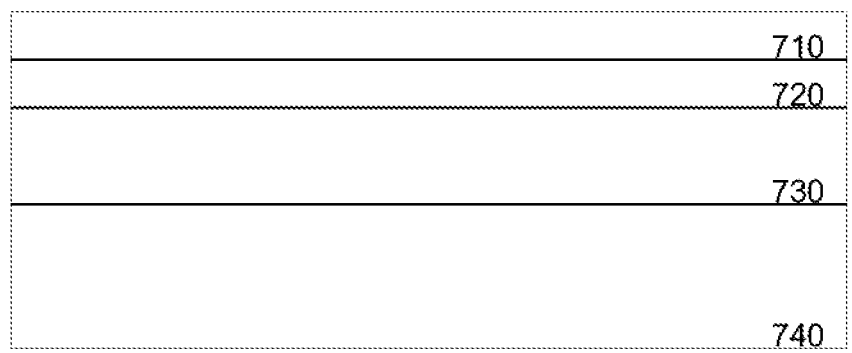
FIG. 7 illustrates a schematic of one or more layers of the contactless card according to an example embodiment.

FIG. 7 illustrates a schematic of one or more layers of the card 700. FIG. 7 may reference the same or similar components of FIGS. 1-6 as explained above.

Card 700 may comprise one or more layers that are laminated together. Although single instances of each layer are depicted in FIG. 7, card 700 may include one or more layers for each layer. In some examples, the card 700 may comprise a first layer 710, such as an outermost or exterior layer which includes a layer that receives paint, ink, or laser treatment. The outermost or exterior layer may comprise the ceiling or top layer of the one or more laminated layers. The outermost or exterior layer may comprise a thin film that receives laser personalization. In some examples, the laser personalization may comprise custom laser personalization.

Card 700 may further comprise a second layer, including one or more artwork layers 720 positioned below the outermost or exterior layer 710. For example, the one or more artwork layers 720 may comprise personalized information about the user and/or financial institution that issues the card 700.

Card 700 may further comprise a third layer 730, including one or more metal core layers positioned below the one or more artwork layers 720.

Card 700 may further comprise a fourth layer 740, including one or more magnetic stripe layer positioned below the one or more metal core layers 730. In some examples, the one or more magnetic stripe layers 740 may comprise the innermost or interior layer of the card 700.

As used herein, the terms "card," "contactless card," and "smartcard" are not limited to a particular type of card. Rather, it is understood that these terms can refer to a contact-based card, a contactless card, or any other card including a chip. It is further understood that the card may be any type of card containing a chip, including without limitation an identity card, a membership card, a loyalty card, an access card, a security card, and a badge.

Exemplary embodiments described herein relate to chips used in smartcards, however, the present disclosure is not limited thereto. It is understood that the present disclosure encompasses chips that may be used in a variety of devices that include electronic components having chips, including without limitation computing devices (e.g., laptop computers, desktop computers, and servers), vehicles (e.g., automobiles, airplanes, trains, and ships), appliances (e.g., televisions, refrigerators, air conditions, furnaces, microwaves, dish washers, smoke detectors, thermostats, and lights), mobile devices (e.g., smartphones and tablets), and wearable devices (e.g., smartwatches).

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "some examples," "other examples," "one example," "an example," "various examples," "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrases "in one example," "in one embodiment," or "in one implementation" does not necessarily refer to the same example, embodiment, or implementation, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A chip fraud prevention system comprising:
    a device including a chip comprising a memory containing an applet, the chip at least partially encompassed in a chip pocket;
    one or more connections communicatively coupled to one or more surfaces of the chip; and
    a capacitance member coupled to a surface of the chip, wherein:
        the capacitance member comprises a known capacitance value,
        the applet is configured to measure the capacitance value of the capacitance member, and
        the capacitance member comprises a spring, the spring having a first end in data communication with the chip and configured to apply a force to a surface of the chip.

2. The chip fraud prevention system of claim 1, wherein the applet is configured to detect a change in the capacitance value of the capacitance member.

3. The chip fraud prevention system of claim 2, wherein the applet is configured to issue a fraud notification upon detecting a change in the capacitance value of the capacitance member.

4. The chip fraud prevention system of claim 1, wherein the capacitance member comprises a capacitance wire, a first end of the capacitance wire in data communication with the chip and a second end of the capacitance wire secured within the chip pocket.

5. The chip fraud prevention system of claim 1, wherein the capacitance value is at least partially based on the length of the capacitance member.

6. The chip fraud prevention system of claim 1, wherein the spring is a conical compression spring.

7. The chip fraud prevention system of claim 1, further comprising a contact pad, wherein one or more or the one or more connections are communicatively coupled to the contact pad.

8. The chip fraud prevention system of claim 1, wherein the chip and capacitance member are adhesively secured within the chip pocket.

9. The chip fraud prevention system of claim 8, wherein the first end is securely connected to the chip using an electrically conductive adhesive.

10. The chip fraud prevention system of claim 1, wherein the device comprises a contactless card.

11. The chip fraud prevention system of claim 1, wherein the chip comprises an integrated circuit.

12. A method of preventing chip fraud, the method comprising the steps of:
    positioning a chip of a device in a reservoir, the chip comprising a memory containing an applet;
    communicatively coupling one or more components to a surface of the chip; and
    coupling a capacitance member to the surface of the chip, wherein:
        the capacitance member comprises a capacitance value,
        the capacitance member comprises a spring having a first end in data communication with the chip and configured to apply a force to a surface of the chip, and
        the applet is configured to detect the capacitance value of the capacitance member.

13. The method of preventing chip fraud of claim 12, further comprising the applet:
    measuring the initial capacitance value of the capacitance member;
    periodically measuring the capacitance value of the capacitance member;
    comparing a measured capacitance value of the capacitance member to the initial capacitance value to detect a change in the capacitance value; and
    issuing a fraud alert upon detecting a change in the capacitance value greater than a predetermined amount.

14. The method of preventing chip fraud of claim 12, wherein the reservoir comprises one or more shapes, the one or more shapes comprising one or more peaks and one or more valleys formed in a saw tooth milling pattern.

15. The method of preventing chip fraud of claim 14, wherein the capacitance member is placed between the at least one of the one or more peaks or one or more valleys, or any combination thereof.

16. The method of preventing chip fraud of claim 12, wherein the spring comprises a capacitance wire comprising the first end and a second end, the method further comprising securing the second end of the capacitance wire within the reservoir.

17. A contactless card including a substrate layer, the contactless card comprising:
    one or more integrated circuits positioned in one or more housings;

one or more connections communicatively coupled to one or more surfaces of each of the one or more integrated circuits, and one or more capacitance members communicatively coupled to one or more surfaces of each of the one or more integrated circuits, wherein:

the one or more capacitance members comprise a known capacitance value based on the length and metal alloy of the capacitance members, the one or more capacitance members comprise a one or more springs, the one or more springs having one or more first ends in data communication with the one or more surfaces of each of the one or more integrated circuits and configured to apply a force to the one or more surfaces.

\* \* \* \* \*